(12) United States Patent
Lee et al.

(10) Patent No.: US 6,927,483 B1
(45) Date of Patent: Aug. 9, 2005

(54) SEMICONDUCTOR PACKAGE EXHIBITING EFFICIENT LEAD PLACEMENT

(75) Inventors: Sun Goo Lee, Seoul (KR); Choon Heung Lee, Kyounggi-do (KR); Sang Ho Lee, Kyounggi-do (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/383,504

(22) Filed: Mar. 7, 2003

(51) Int. Cl.[7] .................. H01L 23/495; H01L 23/48; H01L 23/04; H01L 23/52; H01L 29/40
(52) U.S. Cl. .................. 257/676; 257/666; 257/692; 257/698; 257/778
(58) Field of Search ............................. 257/787, 690, 257/692, 784, 666, 670, 676, 693, 698, 778

(56) References Cited

U.S. PATENT DOCUMENTS

| | | |
|---|---|---|
| 5,041,902 A | 8/1991 | McShane |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |

(Continued)

FOREIGN PATENT DOCUMENTS

DE   19734794 A1   8/1997

(Continued)

OTHER PUBLICATIONS

JEDEC Solid State Product Outline, "2 Lead Header Family Surface Mounted (Peripheral Terminals)", 4 pages.

(Continued)

*Primary Examiner*—Nathan J. Flynn
*Assistant Examiner*—Victor A. Mandala, Jr.
(74) *Attorney, Agent, or Firm*—Stetina Brunda Garred & Brucker

(57) ABSTRACT

A semiconductor package exhibiting efficient placement of semiconductor leads in a micro lead frame design is provided. An integrated circuit die is bonded to the top surfaces of leads, thereby allowing the leads to partially reside under the die. As a result, surface area on the bottom surface of the semiconductor package is recaptured. The die can be further bonded a die paddle if so desired. One or more channels can be cut into the bottom surface of the package in order to separate first and second leads. Such channels allow separate leads to be fabricated from a single lead member which is subsequently cut.

24 Claims, 18 Drawing Sheets

U.S. PATENT DOCUMENTS

| | | |
|---|---|---|
| 5,279,029 A | 1/1994 | Burns |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,604,376 A | 2/1997 | Hamburgen et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,644,169 A | 7/1997 | Chun |
| 5,646,831 A | 7/1997 | Manteghi |
| 5,650,663 A | 7/1997 | Parthasarathi |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,736,432 A | 4/1998 | Mackessy |
| 5,745,984 A | 5/1998 | Cole, Jr. et al. |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,025,640 A | 2/2000 | Yagi et al. |
| 6,031,279 A | 2/2000 | Lenz |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,722 A | 7/2000 | Lee et al. |
| 6,100,594 A | 8/2000 | Fukui et al. |
| 6,113,473 A | 9/2000 | Costantini et al. |
| 6,118,174 A | 9/2000 | Kim |
| 6,118,184 A | 9/2000 | Ishio et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,194,777 B1 | 2/2001 | Abbott et al. |
| 6,197,615 B1 | 3/2001 | Song et al. |
| 6,242,281 B1 * | 6/2001 | Mclellan et al. ............ 438/106 |
| 6,358,778 B1 * | 3/2002 | Shinohara ................. 438/123 |
| 6,410,979 B2 * | 6/2002 | Abe ........................ 257/684 |
| 6,498,099 B1 * | 12/2002 | McLellan et al. ........... 438/689 |
| 6,713,322 B2 * | 3/2004 | Lee ........................ 438/123 |
| 6,838,751 B2 * | 1/2005 | Cheng et al. .............. 257/666 |
| 2003/0164554 A1 * | 9/2003 | Fee et al. ................. 257/787 |
| 2003/0168719 A1 * | 9/2003 | Cheng et al. .............. 257/666 |
| 2003/0201520 A1 * | 10/2003 | Knapp et al. .............. 257/666 |

FOREIGN PATENT DOCUMENTS

| | | |
|---|---|---|
| EP | 54021117 | 6/1979 |
| EP | 59050939 | 3/1984 |
| EP | 0720225 | 3/1996 |
| EP | 0720234 | 3/1996 |
| EP | 0794572 A2 | 10/1997 |
| EP | 0844665 | 5/1998 |

| | | |
|---|---:|---|
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 629639 | 1/1987 |
| JP | 63205935 | 8/1988 |
| JP | 63233555 | 9/1988 |
| JP | 63249345 | 10/1988 |
| JP | 63316470 | 12/1988 |
| JP | 64054749 | 3/1989 |
| JP | 1106456 | 4/1989 |
| JP | 4098864 | 3/1992 |
| JP | 5129473 | 5/1993 |
| JP | 5166992 | 7/1993 |
| JP | 5283460 | 10/1993 |
| JP | 692076 | 4/1994 |
| JP | 6260532 | 9/1994 |
| JP | 7297344 | 11/1995 |
| JP | 7312405 | 11/1995 |
| JP | 864634 | 3/1996 |
| JP | 8125066 | 5/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9293822 | 11/1997 |
| JP | 10199934 | 7/1998 |
| JP | 10256240 | 9/1998 |
| JP | 10022447 | 10/1998 |
| JP | 00150785 | 5/2000 |
| KR | 941979 | 1/1994 |
| KR | 199772358 | 11/1997 |
| KR | 100220154 | 6/1999 |
| KR | 0049944 | 6/2002 |
| WO | 9956316 | 11/1999 |
| WO | 9967821 | 12/1999 |

OTHER PUBLICATIONS

Mannion, P., "MOSFETs Break Out of the Shackles of Wirebonding", Electronic Design, vol. 47, #6 (Mar. 22, 1999).

Micro Electronics Packaging Handbook, 1989, edited by R. Tummale & E. Rymaszewski, published by Van Nostrand Reinhold, New York, NY.

National Semiconductor Application Note 1187, "Leadless Leadframe Package (LLP)", Oct., 2002, http://www.national.com/an/AN/AN-1187.pdf.

Vishay Siliconix Press Release, http://www.siliconix.com/www/200/pr98/4430.html, Dec. 9, 1998, pp. 1-3.

* cited by examiner

SEMICONDUCTOR PACKAGE EXHIBITING EFFICIENT LEAD PLACEMENT

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates generally to integrated circuit chip package technology, and more particularly to a unique package design that facilitates the efficient placement of the leads therein.

Integrated circuit dies are conventionally enclosed in plastic packages that provide protection from hostile environments and enable electrical interconnection between the integrated circuit die and an underlying substrate such as a printed circuit board ("PCB").

Semiconductor packages employing micro lead frames ("MLF") typically include a metal lead frame (often made from copper (Cu)), an integrated circuit die, bonding material to attach the integrated circuit die to the lead frame, bond wires which electrically connect pads on the integrated circuit die to individual leads of the lead frame, and a hard plastic encapsulant material which covers the other components and forms the exterior of the package.

The lead frame is the central supporting structure of such packages. A portion of the lead frame is internal to the package, i.e., completely surrounded by the plastic encapsulant. Portions of the leads of the lead frame extend externally from the package or are partially exposed within the encapsulant material for use in electrically connecting the die to the underlying substrate. Due to the relatively short electrical path from the die to the lead, such MLF packages can exhibit improved electrical efficiency in comparison to conventional Quad Flat Package ("QFP") designs.

One of the drawbacks associated with certain MLF semiconductor packages is the limited surface area available to accommodate leads. Modern integrated circuit dies often include larger numbers of input and output pads than previous dies. To accommodate these additional pads, increasing numbers of leads must also be provided with semiconductor packages. Unfortunately, conventional MLF designs typically require these leads to be located on the bottom surface of the semiconductor package around the perimeter of a die paddle portion of the lead frame. Thus, the limited surface area available for lead placement on such packages can significantly impact the number of leads provided.

The present invention addresses this problem by providing various chip on lead configurations ("COL") which position portions of leads underneath the integrated circuit die, thereby allowing more efficient use of the semiconductor package bottom surface area.

BRIEF SUMMARY OF THE INVENTION

The present invention is directed to a semiconductor package design that exhibits efficient placement of semiconductor leads within the limited surface area available on the bottom of such packages.

In one embodiment, an integrated circuit chip package is provided having an integrated circuit die bonded to portions of the top surfaces of leads. As a result of bonding the die to the leads rather than to only a separate die paddle, the leads are caused to partially reside under the die. As a result, surface area that would otherwise be consumed by the leads can be used for other leads, thus making the placement of leads in such a package more efficient. The die can be further bonded to a separate die paddle if so desired.

In another embodiment, one or more channels are provided in a bottom surface of the package, the channels effectively separating various sets of leads from each other. Such channels may be formed during the manufacture of such packages, allowing separate leads to be fabricated from a single, cut lead member.

Methods of manufacturing semiconductor chip packages exhibiting these features are also provided. These and other embodiments of the present invention, are discussed in more detail below.

The present invention is best understood by reference to the following detailed description when read in conjunction with the accompanying drawings.

BRIEF DESCRIPTION OF THE DRAWINGS

These as well as other features of the present invention will become more apparent upon reference to the drawings wherein.

Common reference numerals are used throughout the drawings and detailed description to indicate like elements.

DETAILED DESCRIPTION OF THE INVENTION

Figure 1A:
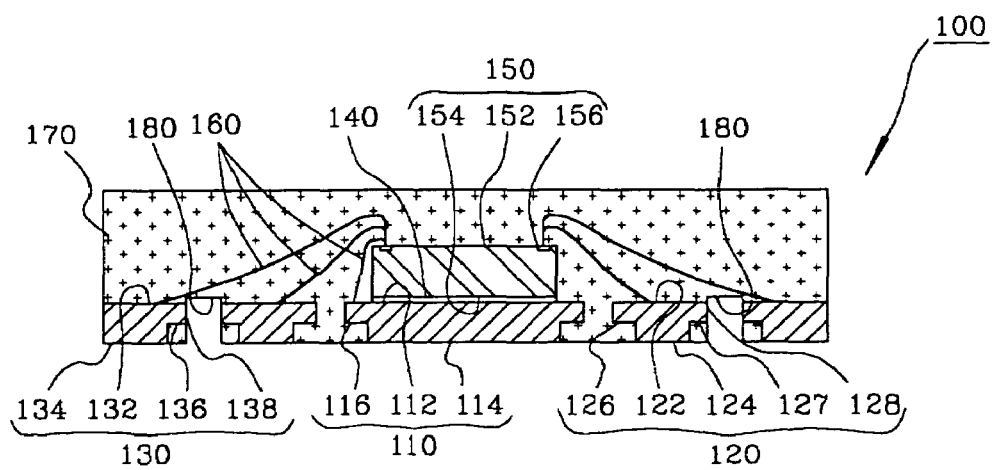
FIG. 1A is a sectional view of a semiconductor package having multiple leads separated by channels.
Figure 1B:
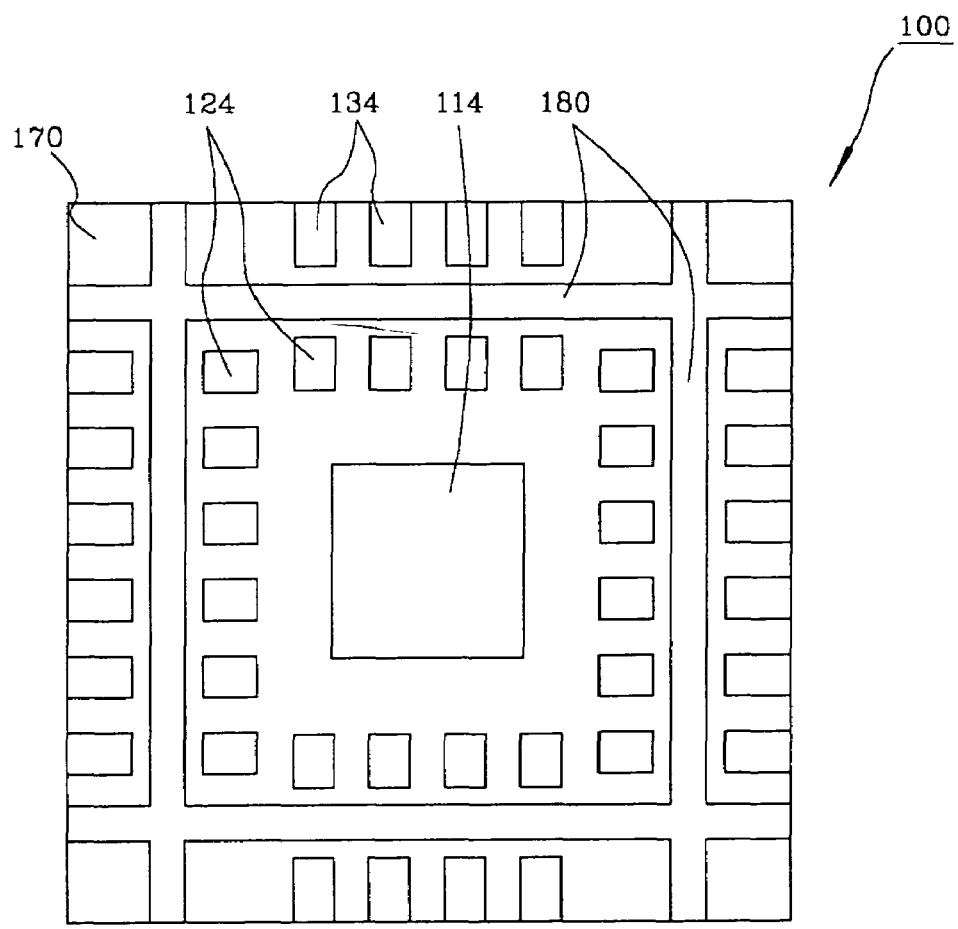
FIG. 1B is a bottom plan view of the semiconductor package of FIG. 1A.
Figure 1C:
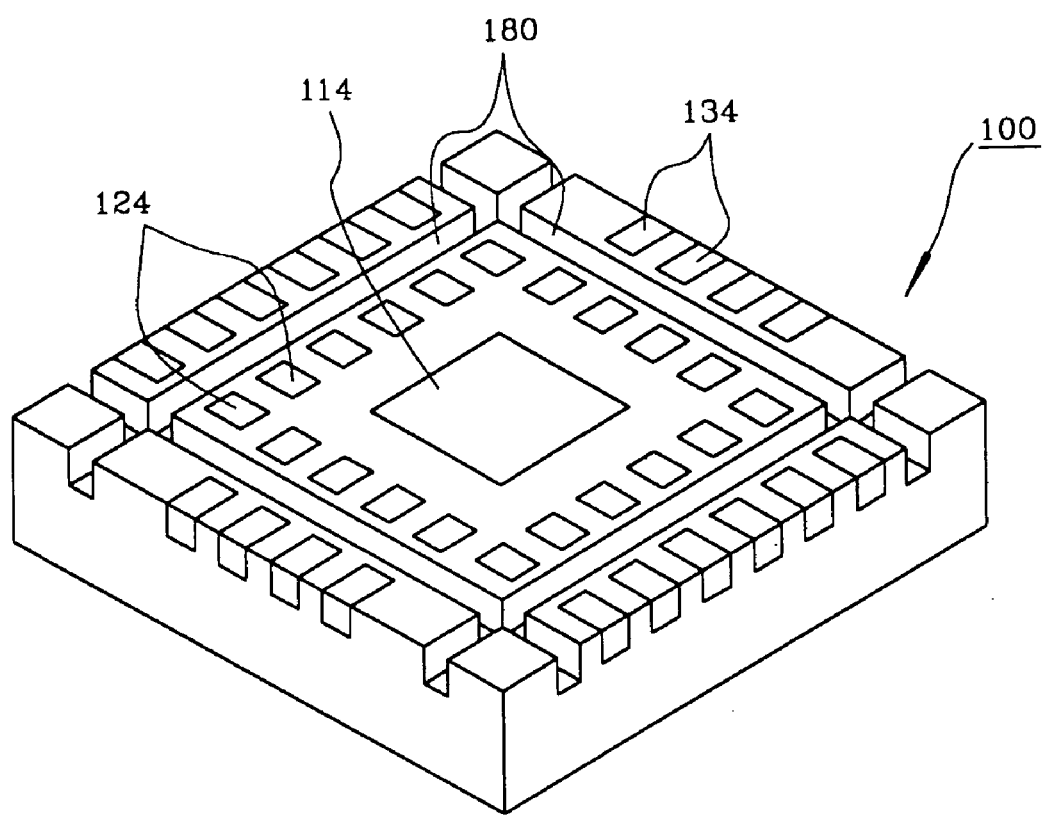
FIG. 1C is a bottom perspective view of the semiconductor package of FIG. 1A.

FIGS. 1A–C provide sectional, bottom, and perspective views of a semiconductor package having multiple leads separated by channels. As shown in the drawings, semiconductor package 100 includes a substantially planar die paddle 110, a plurality of first leads 120, a plurality of second leads 130, an integrated circuit die 150 bonded to the die paddle 110, and conductive wires 160 for electrically connecting the integrated circuit die 150 to the first and second leads 120 and 130. Encapsulant 170 is provided for encapsulating die paddle 110, leads 120 and 130, integrated circuit die 150, and conductive wires 160. In addition, portions of leads 120 and 130 are exposed in an exterior surface of the encapsulant 170.

Die paddle 110 includes substantially planar top and bottom surfaces 112 and 114. Portions of bottom surface 114 are etched to form substantially planar partially etched surfaces 116. As a result, the area of bottom surface 114 is reduced in relation to the area of top surface 112. In one embodiment, the thickness of the die paddle 110 between top surface 112 and etched surface 116 is approximately 25~75% of the thickness between top surface 112 and bottom surface 114. Etched surface 116 serves to increase the bonding force between die paddle 110 and the encapsulant 170, as well as to elongate the passage through which moisture must travel to permeate the interface between die paddle 110 and encapsulant 170. As a result, the reliability of semiconductor package 100 is improved.

First leads 120 include opposed, substantially planar top and bottom surfaces 122 and 124, respectively. The bottom surfaces 124 are also partially etched to form partially etched surfaces 126 and 127. As illustrated in FIGS. 1B–C, first leads 120 are arranged in a generally square pattern around the perimeter of die paddle 110. Each of the first leads 120 is also separated from die paddle 110 at a predetermined distance. In another embodiment, the thickness of the first leads 120 between top surfaces 122 and etched surfaces 126 or 127 is approximately 25~75% of the thickness of the first leads 120 between top surfaces 122 and bottom surfaces 124. Etched surface 126 serves to increase the bonding force between the leads 120 and the encapsulant 170 as well as to elongate the passage through which moisture must travel to permeate the interface between the first leads 120 and encapsulant 170. Etched surface 127 serves primarily to increase the bonding force between each first lead 120 and encapsulant 170.

As illustrated in FIGS. 1B–C, second leads 130 are also arranged in a generally square pattern. The second leads 130 are separated from and disposed outwardly of first leads 120, and extend to respective ones of the four peripheral sides defined by the encapsulant 170. The second leads 130 are separated from respective ones of the first leads 120 by a predetermined distance. In the package 100, each of the second leads 130 is preferably aligned with a respective one of the first leads 120. Second leads 130 each include opposed, substantially planar top and bottom surfaces 132 and 134, respectively. The bottom surfaces 134 are partially etched to form partially etched surfaces 136. Etched surfaces 136 serve primarily to increase the bonding force between the second leads 130 and encapsulant 170.

Integrated circuit die 150 includes opposed, substantially planar top and bottom surfaces 152 and 154, respectively. A plurality of bond pads 156 are formed on top surface 152. Bottom surface 154 is bonded to top surface 112 of die paddle 110 by an adhesive 140. It will be understood that the adhesive 140 (as well as the other adhesives described herein) may be an epoxy, adhesive film, or other adhesives known in the art. In one embodiment, the area of the bottom surface 154 of the integrated circuit die 150 is smaller than that of the top surface 112 of the die paddle 110, thus allowing conductive wires 160 to easily bond to the edge of the top surface 112 of die paddle 110.

As illustrated in FIG. 1A, conductive wires 160 serve to connect bond pads 156 to top surfaces 122 of the first leads 120, top surfaces 132 of the second leads 130, and/or the top surface 112 of the die paddle 110. Connecting the bond pads 156 to the top surface 112 of die paddle 110 permits ground signals of the integrated circuit die 150 to be transmitted to the die paddle 110, thus improving the electrical efficiency of the package 100. Although the first and second leads 120 and 130 are typically used for signaling or power, the first and second leads 120 and 130 may alternatively be used for grounding. Conductive wires 160 (as well as the other conductive wires described herein) can be fabricated from aluminum (Al), copper (Cu), gold (Au), silver (Ag), or other materials known in the art.

Die paddle 110, first and second leads 120 and 130, integrated circuit die 150, and conductive wires 160 are encapsulated by the encapsulant 170. The bottom surface 114 of die paddle 110 as well as the bottom surfaces 124 and 134 of the first and second leads 120 and 130 are exposed in an exterior surface of the encapsulant 170 (i.e., the bottom surface thereof). The encapsulant 170 (as well as the other encapsulants described herein) can comprise conventional epoxy molding compound, epoxy resin, or other materials known in the art.

Channels 180 having predetermined depths are formed in the encapsulant 170 between the first leads 120 and the second leads 130, thus separating adjacent ends of the first and second leads 120 and 130 from each other. Specifically, channels 180 are formed between the partially etched surfaces 127 of the first leads 120 and the partially etched surfaces 136 of the second leads 130. Thus, the channels 180 extend in a generally square pattern. In one embodiment, the depth of the channels 180 is slightly greater than the thickness of first and second leads 120 and 130. As illustrated in FIGS. 1B–C, four intersecting channels 180 can be provided that extend lengthwise along the bottom surface of the encapsulant 170 forming a quad-shaped pattern as indicated above. As illustrated in FIG. 1A, side surfaces 128 and 138 adjacent to the partially etched surfaces 127 and 136 of leads 120 and 130 are exposed in an exterior surface of the encapsulant 170 within the channels 180. Thus, channels 180 allow first and second leads 120 and 130 to be physically separated and electrically insulated from each other. Since bottom surfaces 124 and 134 the leads 120 and 130 lead are exposed in the lower surface of the encapsulant 170, the number of input and output pads is maximized in the semiconductor package 100.

Figure 2A:
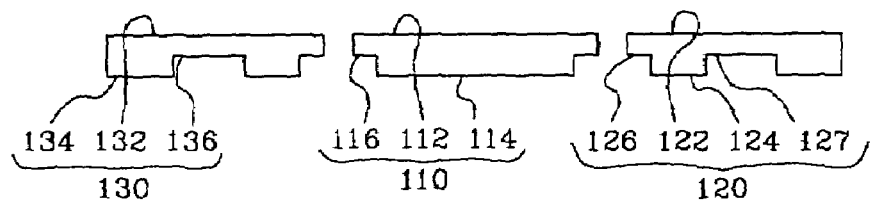
FIGS. 2A–E are sectional views illustrating a method for manufacturing the semiconductor package of FIG. 1A.

FIGS. 2A–E provide sectional views which illustrate an exemplary method for manufacturing the semiconductor package 100 of FIG. 1A. As shown in FIG. 2A, a die paddle 110 is provided having substantially planar top and bottom surfaces 112 and 114, and a partially etched surface 116 of a predetermined depth formed at an edge of the bottom surface 114. A plurality of first leads 120 are provided having substantially planar top and bottom surfaces 122 and 124, and partially etched surfaces 126 and 127 of predetermined depths formed on bottom surfaces 124. First leads 120 are separated from die paddle 110 by a predetermined distance. A plurality of second leads 130 are connected to respective ones of the first leads 120, each second lead 130 having substantially planar top and bottom surfaces 132 and 134, and a partially etched surface 136 of predetermined depth formed on bottom surface 132. First and second leads 120 and 130 are initially joined together and held in place by a dam bar. When the first and second leads 120 and 130 are initially joined together, the partially etched surfaces 127 and 136 thereof are continuous. The dam bar (not shown) prevents the leads from easily bending. The dam bar is removed during a subsequent channel forming step to ensure that the first and second leads 120 and 130 are electrically insulated from each other in the finished semiconductor package 100. As indicated above, while the first and second leads 120 and 130 are joined together, partially etched surfaces 127 and 136 are adjacent to each other, thus forming a continuous partially etched surface.

Figure 2B:
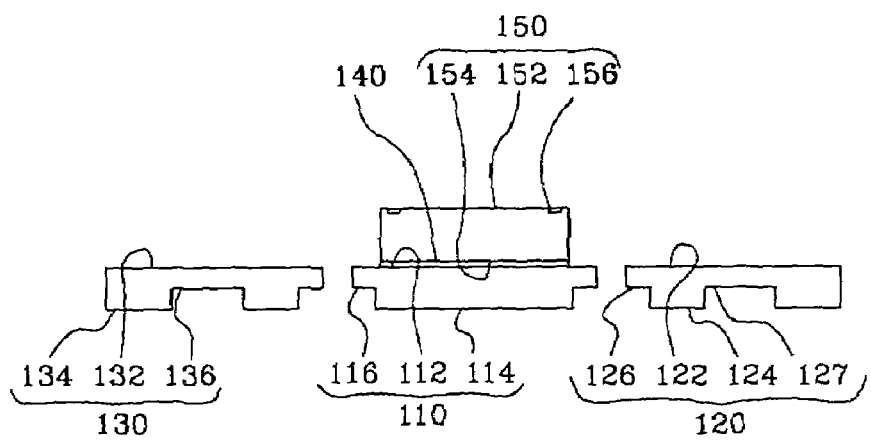

FIG. 2B illustrates a die attaching step used in the manufacture of semiconductor package 100. Bottom surface 154 of integrated circuit die 150 is bonded to the top surface 112 of die paddle 110 by adhesive 140.

Figure 2C:
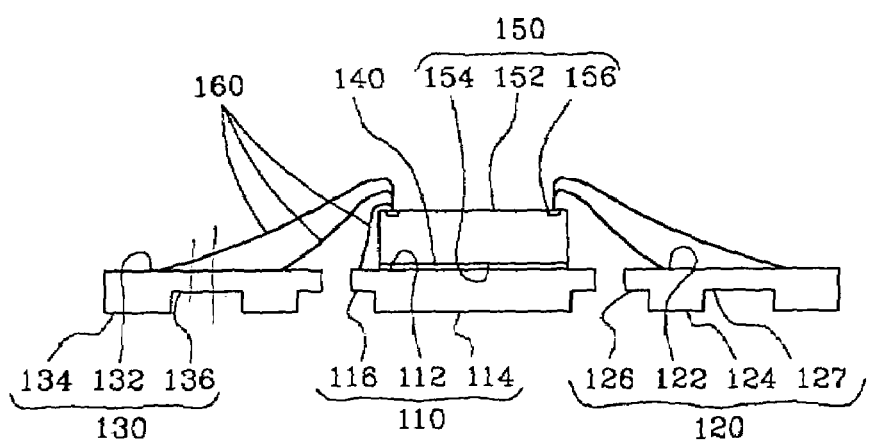

FIG. 2C illustrates a wire bonding step used in the manufacture of semiconductor package 100. Bond pads 156 are electrically connected to the top surfaces of the first leads 120, second leads 130, and die paddle 110 through the use of the conductive wires 160.

Figure 2D:
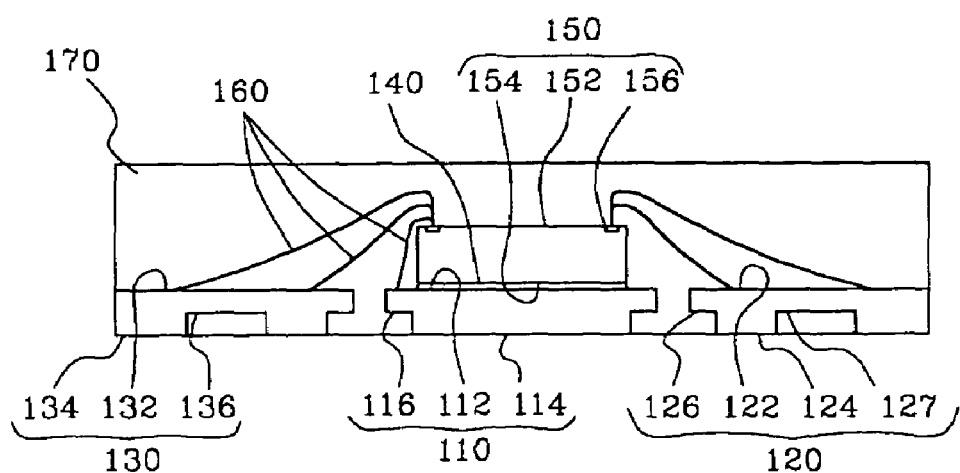

FIG. 2D illustrates an encapsulating step used in the manufacture of semiconductor package 100. Die paddle 110, first and second leads 120 and 130, die 150, and conductive wires 160 are encapsulated by encapsulant 170. The encapsulant 170 protects these components from the external environment and allows the semiconductor package 100 to be mounted on external devices in a fixed shape. In addition, bottom surfaces 114, 124, and 134 remain exposed in the bottom surface of the encapsulant 170.

Figure 2E:
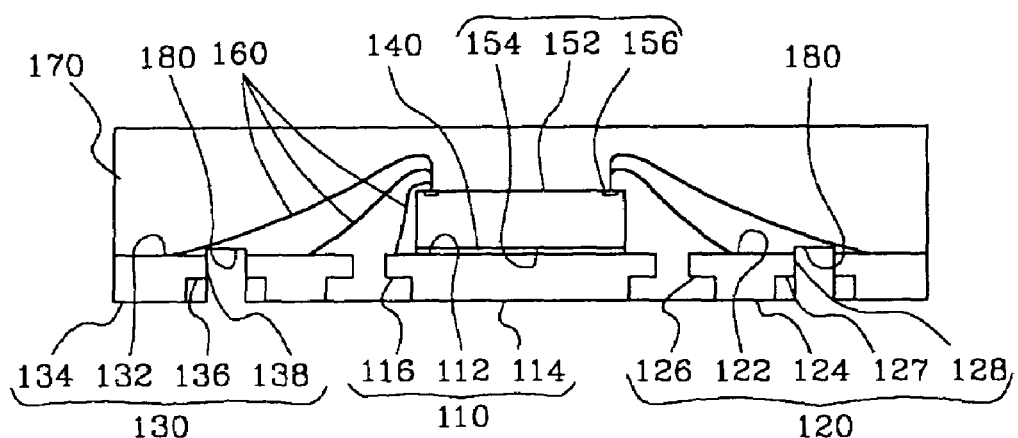

FIG. 2E illustrates a channel forming step used in the manufacture of semiconductor package 100. Channels 180 are formed between the first leads 120 and the second leads 130, and pass through portions of the partially etched surfaces 127 and 136. Portions of the encapsulant 170 and partially etched surfaces 127 and 136 are cut, thus forming channels 180. It will be appreciated that channels 180 can be cut by lasers, blades, or other tools and/or methods known in the art. As a result of this cutting operation, first and second leads 120 and 130 are separated from each other. The bottom surfaces 124 and 134 of the severed first and second leads 120 and 130 are arrayed in columns and in rows at the lower surface of the encapsulant 170, thereby maximizing the number of input and output pads in the semiconductor package 100.

As indicated above, the width of channels 180 can be made smaller than that of the partially etched surface 127 or the partially etched surface 136 such that predetermined regions of the partially etched surfaces 127 and 136 are located in the inside of the encapsulant 170, thereby increasing the bonding force between the encapsulant 170 and the first and second leads 120 and 130. This width also allows any burrs generated by blade cutting the channels 180 to be minimized. As discussed above, the dam bar holding leads 120 and 130 is removed during the channel forming step to ensure that the first and second leads 120 and 130 are electrically insulated from each other. In one embodiment, the width of the dam bar is smaller than that of partially etched surfaces 126 and 127, and channels 180, thus facilitating its complete removal as a result of the cutting operation.

Figure 3:
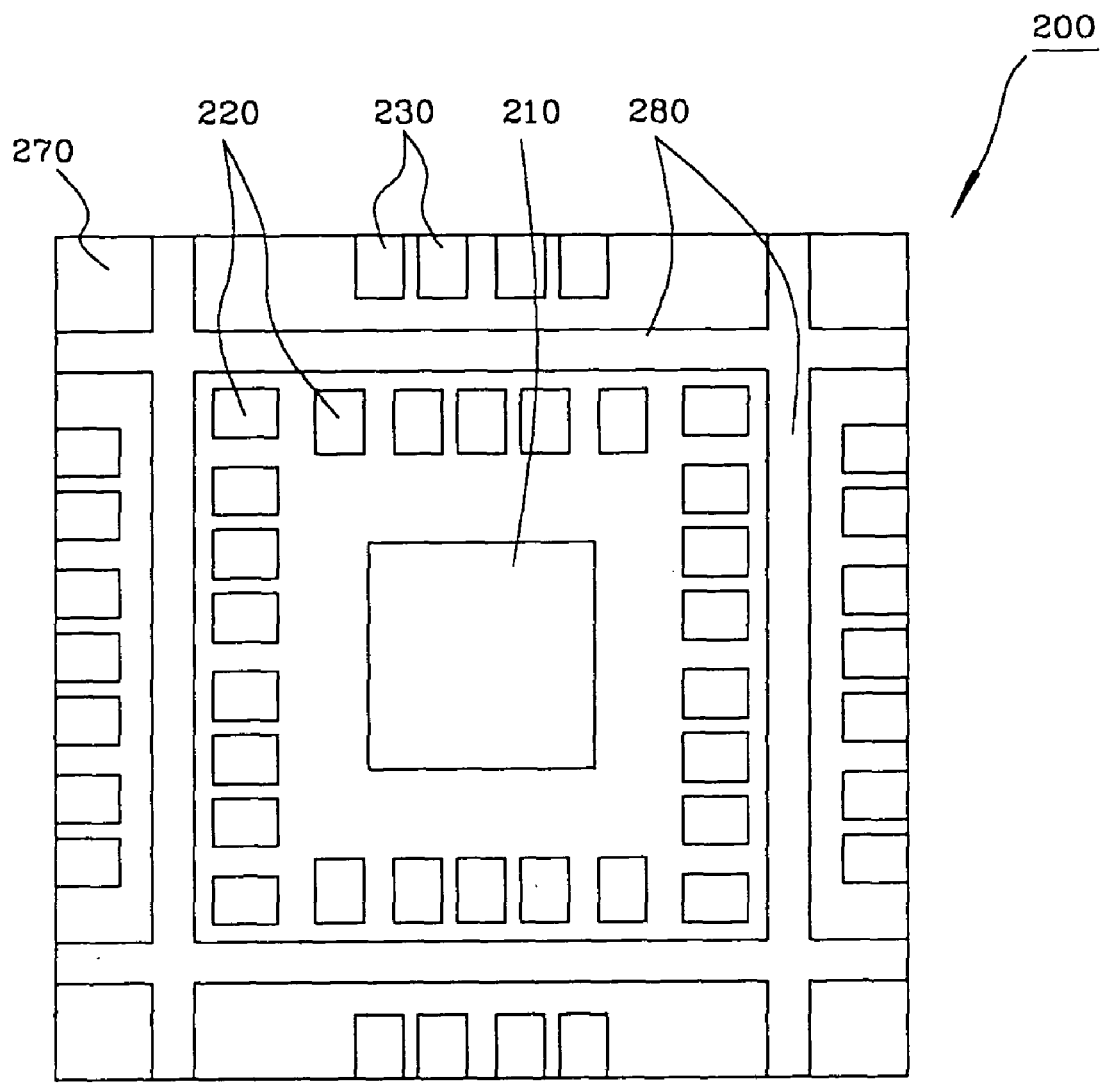
FIG. 3 is a bottom plan view of a semiconductor package having first and second leads staggered in relation to each other.
Figure 3A:
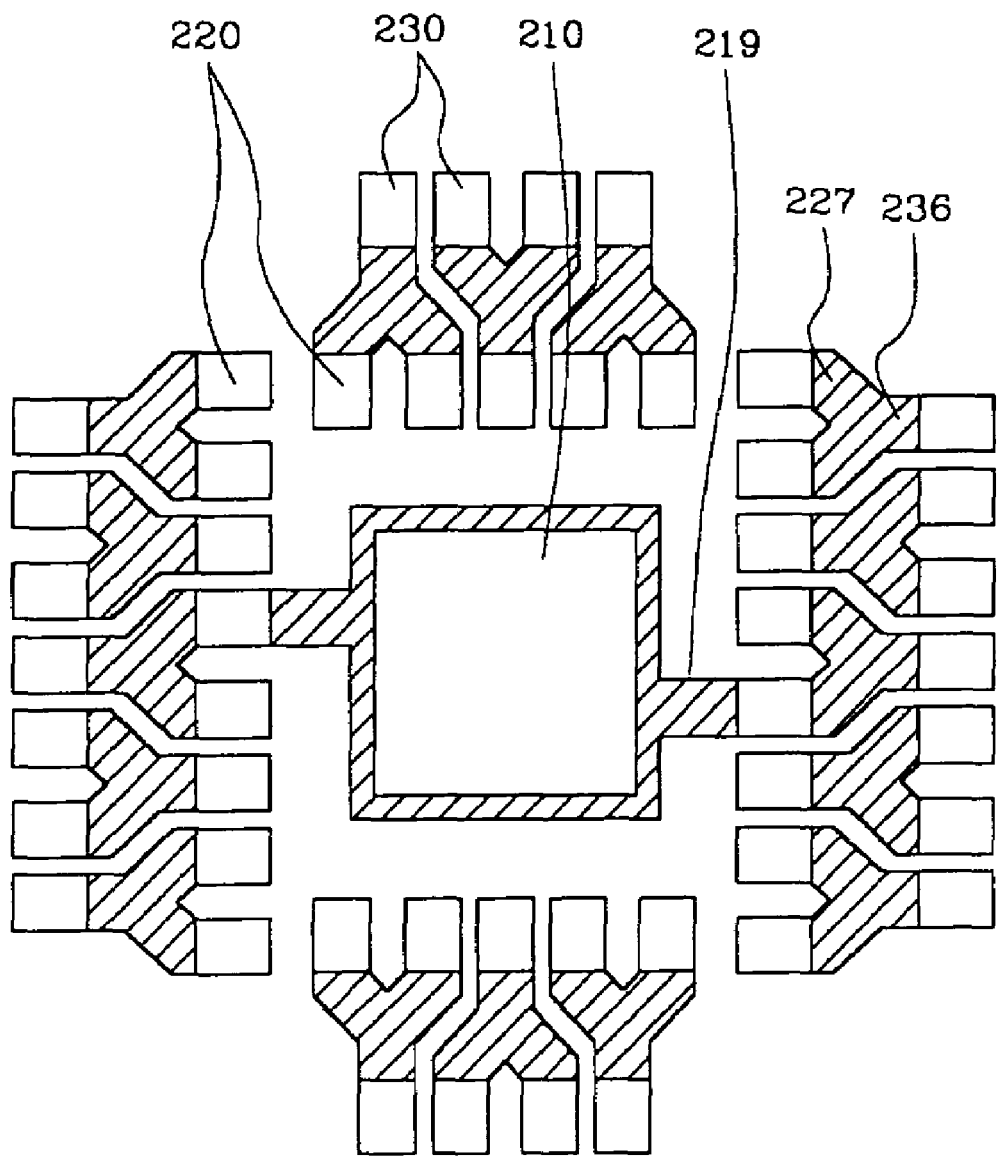
FIG. 3A is a bottom plan view showing a lead frame providing step in a method for manufacturing the semiconductor package of FIG. 3.
Figure 3B:
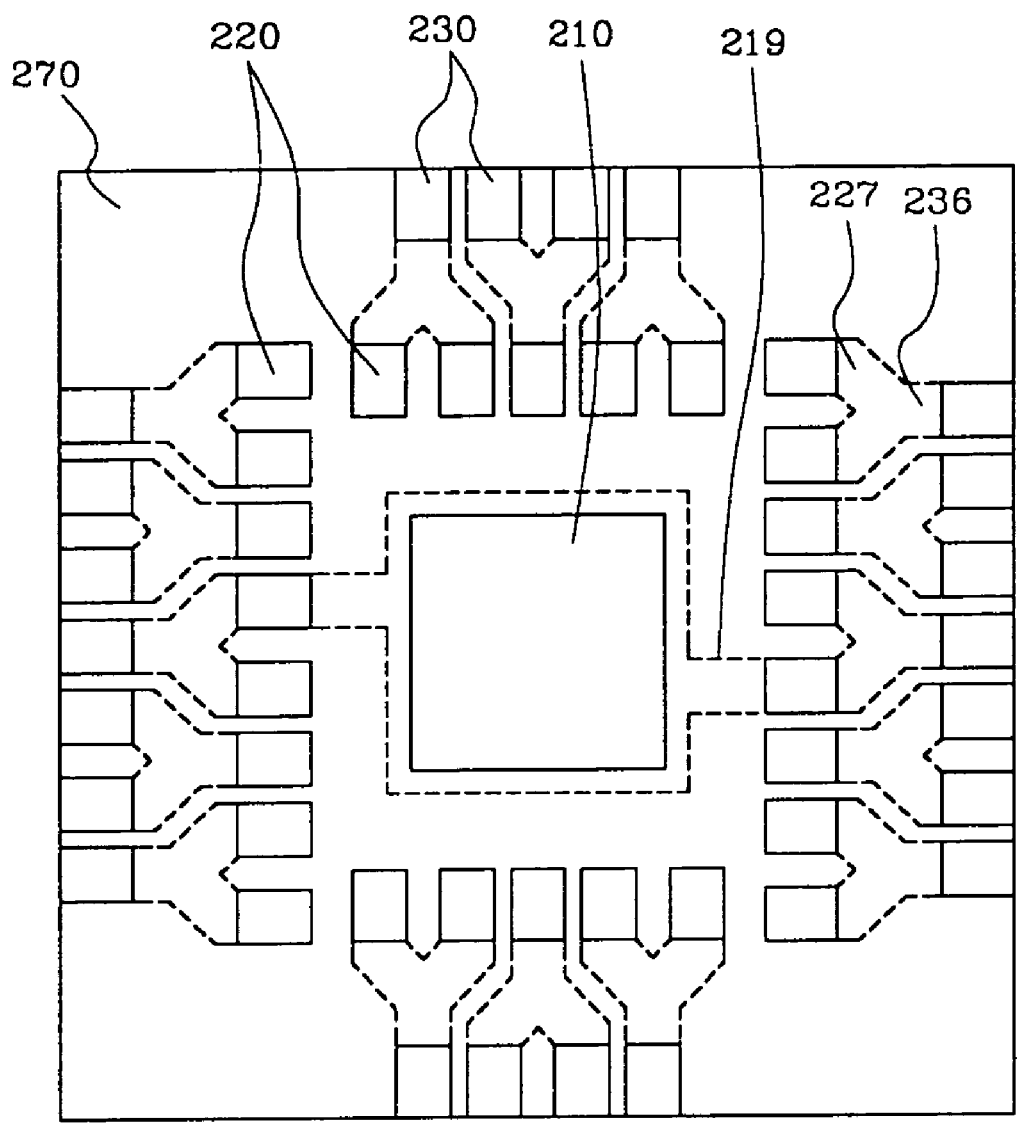
FIG. 3B is a bottom plan view showing an encapsulating step in a method for manufacturing the semiconductor package of FIG. 3.
Figure 3C:
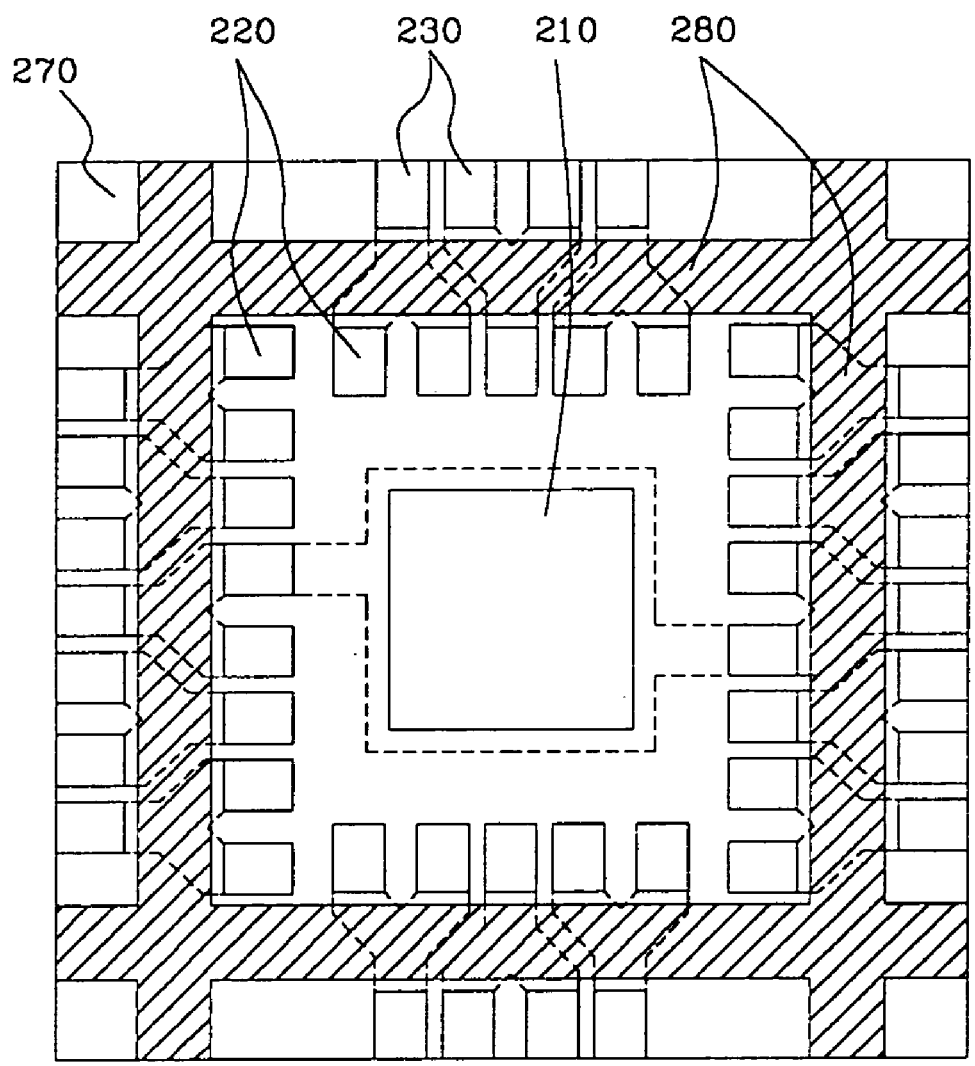
FIG. 3C is a bottom plan view showing a channel formation step in a method for manufacturing the semiconductor package of FIG. 3.

FIGS. 3–3C illustrate a semiconductor package 200 having first and second leads staggered in relation to each other. Although package 200 of FIGS. of 3–3C exhibits similarities to package 100 of FIGS. 1A–B, differences between the packages 100 and 200 will be described below.

As shown in FIG. 3, a plurality of first leads 220 and a plurality of second leads 230 are staggered in relation to each other as viewed from the bottom surface of encapsulant 270. It will be appreciated that the number of the first leads 220 illustrated within the perimeter of channels 280 is greater than the number of second leads 230 illustrated outside the channels 280. In alternate embodiments, the reverse is also possible.

Similar to package 100, partially etched surfaces (not shown) inside encapsulant 270 are formed in the first leads 220 adjacent to the channels 280. Other partially etched surfaces (not shown) inside the encapsulant 270 are formed in the second leads 230 adjacent to channels 280.

The staggered orientation of the first and second leads 220 and 230 makes easier the wire bonding of the die of package 200 (not shown) to the first and second leads 220 and 230, allowing the conductive wires (not shown) used to bond the die with the leads 220 and 230 to be oriented in different directions relative to each other, thus reducing the length of wire required and susceptibility to shorting. The staggered orientation also increases the solder bonding force exhibited between package 200 and an external device (not shown). Since the first and second leads 220 and 230 are closely arrayed at the bottom surface of the encapsulant 270 in this orientation, the solder bonding force between the leads 220 and 230 and the external device increases.

FIG. 3A illustrates a lead frame providing step used in the manufacture of semiconductor package 200. Partially etched surfaces 227 and 236 are represented as deviant lines in FIG. 3A. The leadframe is constructed in a manner wherein certain ones of the inner, first leads 220 transition into a pair of outer, second leads 230, and certain ones of the outer, second leads 230 transition into a pair of inner, first leads 220. The second leads 230 extend to respective ones of four peripheral sides or edges defined by the encapsulant 270. In various embodiments, the first and second leads 220 and 230 extend in generally square patterns about the periphery of the die paddle 210. As illustrated in FIG. 3A, several of the first leads 220 are connected to connecting leads 219 of the die paddle 210 in order to support the die paddle 210. In addition, the connecting leads 219 include partially etched surfaces which can be encapsulated in a subsequent step.

As also illustrated in FIG. 3A, partially etched surfaces 227 and 236 are formed where the first and second leads 220 and 230 are joined and diverge. In one embodiment, partially etched surfaces 227 and 236 are flush or continuous with each other.

FIG. 3B illustrates an encapsulating step used in the manufacture of semiconductor package 200. After the leadframe has been encapsulated, partially etched surfaces 227 and 236 (represented as broken lines in FIG. 3B) between the first and second leads 220 and 230 are located inside encapsulant 270. Accordingly, these partially etched surfaces 227 and 236 serve to improve the bonding force between first and second leads 220 and 230 and the encapsulant 270.

FIG. 3C illustrates a channel formation step used in the manufacture of semiconductor package 200. Four intersecting channels 280 are formed in the bottom surface of encapsulant 270. The channels 280 extend lengthwise along the bottom surface of encapsulant 270, thus forming a quad-shaped pattern. In one embodiment, the width of the channels 280 is smaller than that of the partially etched surfaces 227 and 236 between the first leads 220 and the second leads 230, thus ensuring that the bonding force between the first and second leads 220 and 230 and the encapsulant 270 is not weakened by the formation of the channels 280. The depth of channels 280 is slightly greater than the thickness of the first and second leads 220 and 230.

Figure 4A:
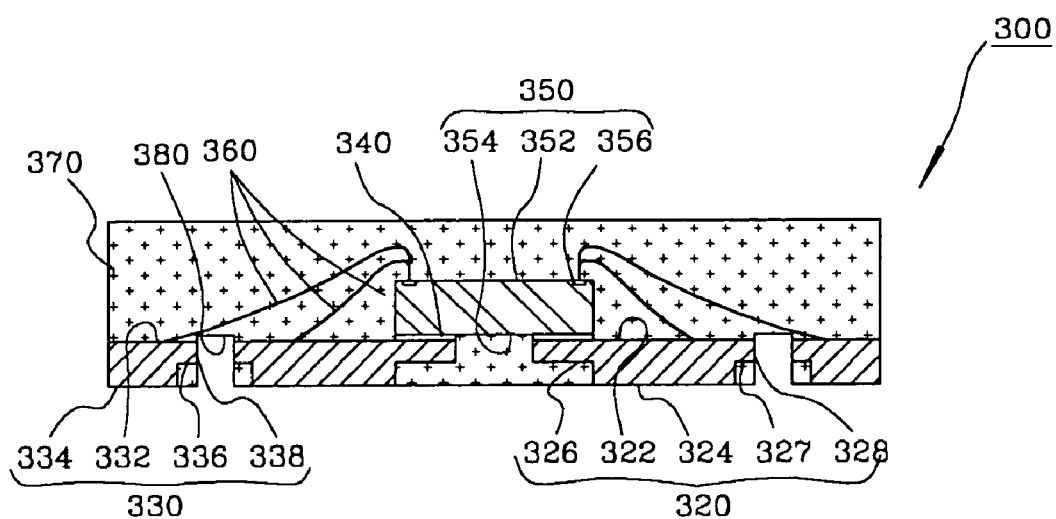
FIG. 4A is a sectional view of a semiconductor package having first and second leads separated by two parallel channels.
Figure 4B:
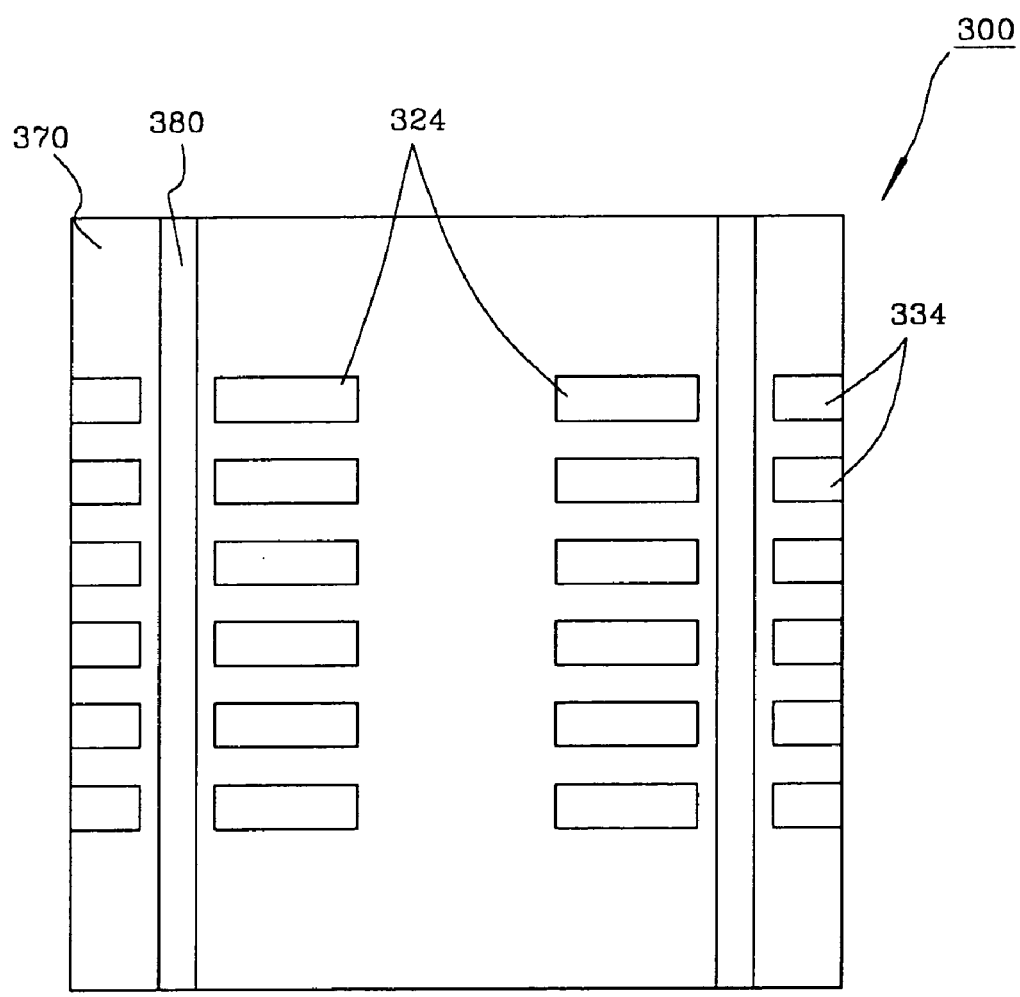
FIG. 4B is a bottom plan view of the semiconductor package of FIG. 4A.

FIGS. 4A–B illustrate a semiconductor package 300 having two parallel channels between first and second leads of the package. Semiconductor package 300 includes a plurality of first leads 320 having opposed, substantially planar top and bottom surfaces 322 and 324, a plurality of second leads 330 having opposed, substantially planar top and bottom surfaces 332 and 334, an integrated circuit die 350 having opposed, substantially planar top and bottom surfaces 352 and 354, and a plurality of conductive wires 360 for electrically connecting the integrated circuit die 350 to the first and second leads 320 and 330. Encapsulant 370 is also provided for encapsulating the first and second leads 320 and 330, the integrated circuit die 350, and the conductive wires 360. In addition, portions of the first and second leads 320 and 330 are exposed in an exterior surface of the encapsulant 370 (i.e., the bottom surface thereof).

As illustrated in FIG. 4B, the first leads 320 are arranged in a spaced, generally parallel pair of rows, with the first leads 320 of one row being aligned with respective ones of the first leads 320 of the remaining row. The first leads 320 of such rows are separated from each other at a predetermined distance. The bottom surfaces 324 of first leads 320 are partially etched to form partially etched surfaces 326 and 327 having a predetermined depth.

As also illustrated in FIG. 4B, the second leads 330 are also segregated into a spaced, generally parallel pair of rows which are disposed outwardly of the rows of the first leads 320. More particularly, each row of the second leads 330 is separated from a respective row of the first leads 320 by a predetermined distance, the second leads 330 of each row extending to a respective one of an opposed pair of sides of the encapsulant 370. The second leads 330 of each row are aligned with respective ones of the first leads 320 of the row disposed closest thereto. The bottom surfaces 334 of second leads 330 are partially etched to form partially etched surfaces 336 having predetermined depths.

The bottom surface 354 of die 350 is placed upon and bonded to inner portions of the top surfaces 322 of the first leads 320 through the use of an adhesive 340. A plurality of bond pads 356 formed at the top surface 352 of die 350 are connected to top surfaces 322 and 332 of first and second leads 320 and 330 by a plurality of conductive wires 360. As seen in FIG. 4A, the die 350 is sized relative to the first leads 320 so as to overlap those portions of the first leads 320 including the partially etched surfaces 326 formed therein.

As illustrated in FIG. 4B, two channels 380 having predetermined depths are formed or cut in the bottom surface of the encapsulant 370. Channels 380 are formed between the partially etched surfaces 327 of the first leads 320 and the partially etched surfaces 336 of the second leads 330, thus physically separating and electrically insulating the first and second leads 320 and 330 from each other. In one embodiment, the channel depth is slightly greater than the thickness of the first and second leads 320 and 330. As also illustrated in FIG. 4B, the channels 380 extend in spaced, generally parallel relation to each other between respective ones of the corresponding rows of the first leads 320 and the second leads 330. After channels 380 are formed, side surfaces 328 and 338 adjacent to the partially etched surfaces 327 and 336 of the first and second leads 320 and 330 are exposed in the encapsulant 370 within the channels 380.

Figure 5A:
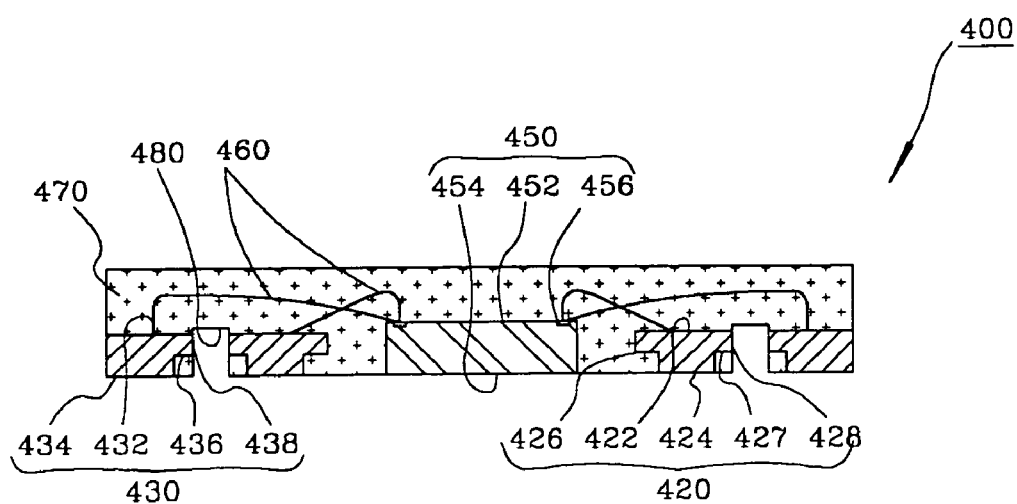
FIG. 5A is a sectional view of a semiconductor package having a die mounted flush with the bottom surface of the package.
Figure 5B:
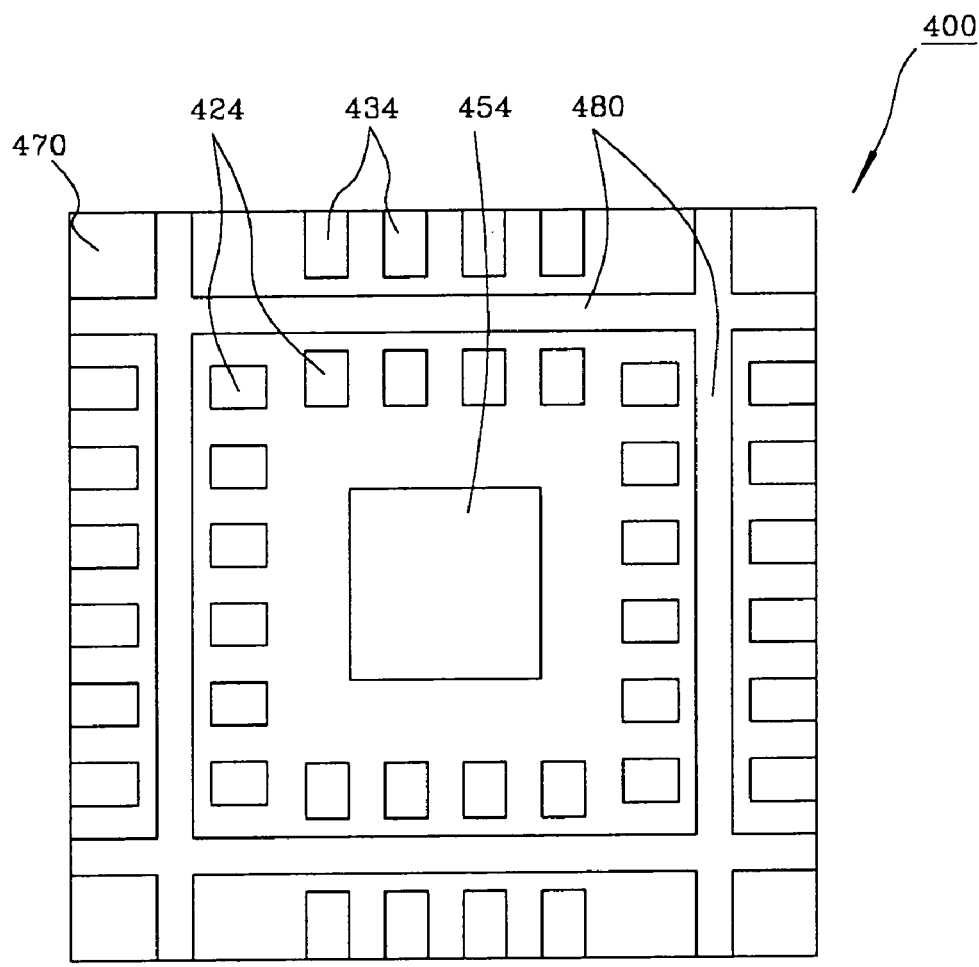
FIG. 5B is a bottom plan view of the semiconductor package of FIG. 5A.

FIG. 5A is a sectional view of a semiconductor package 400 having a die mounted flush with the bottom surface of the package 400. FIG. 5B is a bottom view of the semiconductor package 400 of FIG. 5A. As shown, semiconductor package 400 includes a plurality of first leads 420 having opposed, substantially planar top and bottom surfaces 422 and 424, a plurality of second leads 430 having opposed, substantially planar top and bottom surfaces 432 and 434, an integrated circuit die 450 having opposed, substantially planar top and bottom surfaces 452 and 454, and a plurality of conductive wires 460 for electrically connecting the integrated circuit die 450 to the first and second leads 420 and 430. Encapsulant 470 is also provided for encapsulating the first and second leads 420 and 430, the integrated circuit die 450, and the conductive wires 460. In addition, portions of the first and second leads 420 and 430 are exposed in an exterior surface of the encapsulant 470.

First leads 420 are symmetrically arrayed in a square or quadrangular pattern about the periphery of the die 450 and separated from each other at a predetermined distance. The bottom surfaces 424 of first leads 420 are partially etched to form partially etched surfaces 426 and 427 having predetermined depths.

As also illustrated in FIG. 5B, the second leads 430 are also arranged in a square or quadrangular pattern outboard of the first leads 420. The second leads 430 are separated from the first leads 420 by a predetermined distance, and extend to respective ones of the four peripheral sides or edges defined by the encapsulant 470. As further shown in FIG. 5B, the first and second leads 420 and 430 are provided in equal numbers, with each of the first leads 420 being aligned with a respective one of the second leads 430. The bottom surfaces 434 of second leads 430 are partially etched to form partially etched surfaces 436 having predetermined depths.

As illustrated in FIG. 5A, integrated circuit die 450 is located in the open area defined by the first leads 420 and is substantially flush with bottom surfaces 424 and 434 of the first and second leads 420 and 430.

A plurality of bond pads 456 formed at the top surface 452 of die 450 are connected to top surfaces 422 and 432 of first and second leads 420 and 430 by a plurality of conductive wires 460.

Channels 480 having predetermined depths are further formed in the bottom surface of the encapsulant 470 in a generally square pattern between the first leads 420 and the second leads 430, thus separating the first and second leads from each other. Channels 480 are formed between the partially etched surfaces 427 of the first leads 420 and the partially etched surfaces 436 of the second leads 430. The depth of the channels 480 is slightly larger than the thickness of first and second leads 420 and 430. As illustrated in FIG. 5B and as indicated above, four intersecting channels 480 can be provided that extend lengthwise along the bottom surface of encapsulant 470 forming a quad-shaped pattern.

As illustrated in FIG. 5B, side surfaces 428 and 438 adjacent to the partially etched surfaces 427 and 436 of the first and second leads 420 and 430 are exposed in the encapsulant 470 within the channels 480. Thus, channels 480 allow first and second leads 420 and 430 to be physically separated and electrically insulated from each other. Since bottom surfaces 424 and 434 of the first and second leads 420 and 430 are arrayed on the lower surface of the encapsulant 470 and exposed therein, the number of input and output pads is maximized in the semiconductor package 400.

Figure 6A:
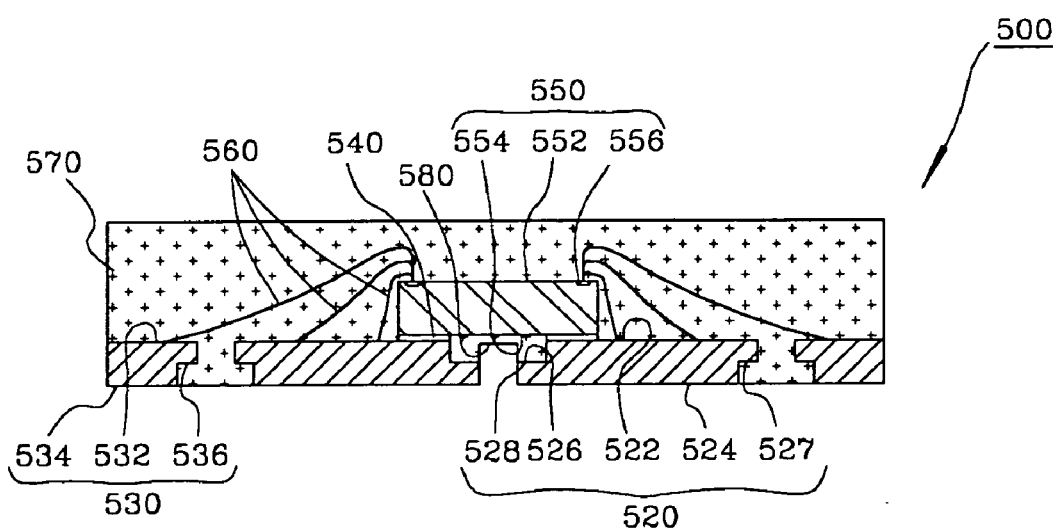
FIG. 6A is a sectional view of a semiconductor package having leads separated by a single channel.
Figure 6B:
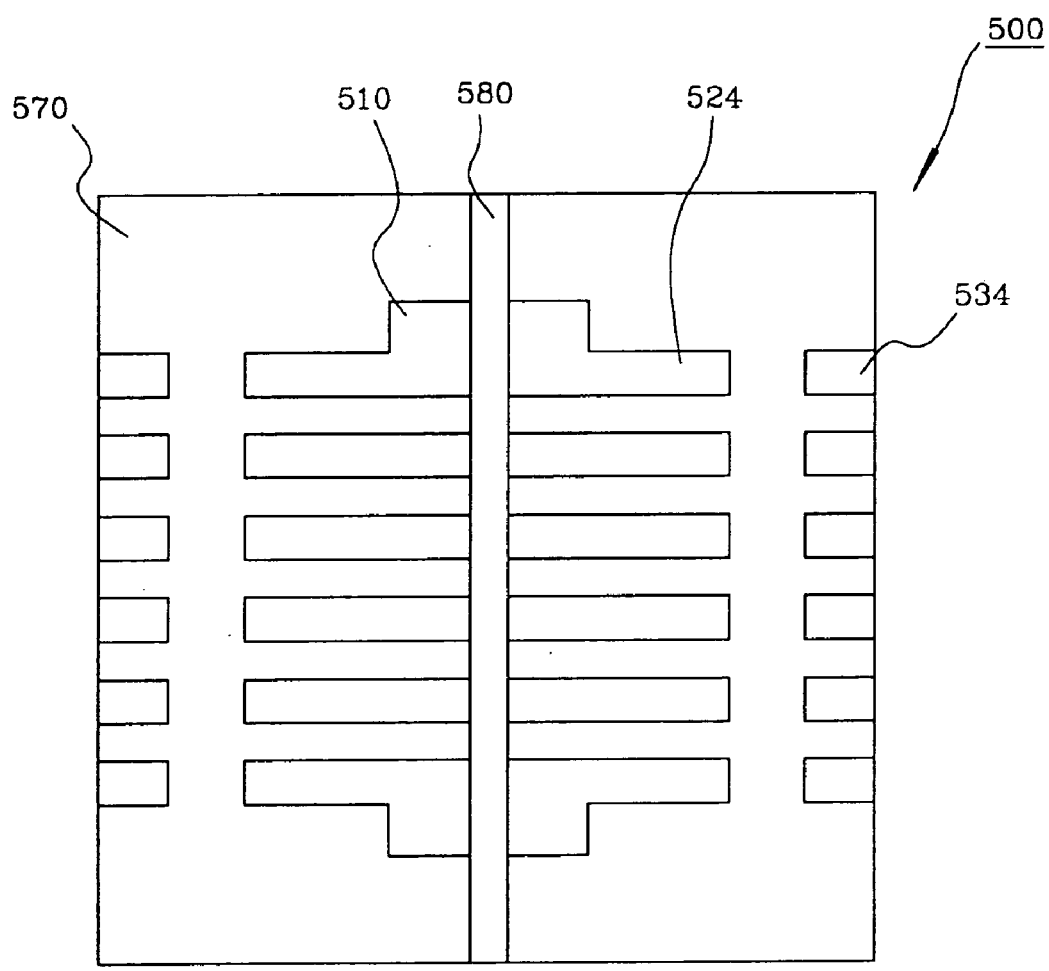
FIG. 6B is a bottom plan view of the semiconductor package of FIG. 6A.

FIG. 6A is a sectional view of a semiconductor package 500 having leads separated by a single channel. FIG. 6B is a bottom view of the semiconductor package 500 of FIG. 6A. As shown, semiconductor package 500 includes a plurality of first leads 520 having opposed, substantially planar top and bottom surfaces 522 and 524, a plurality of second leads 530 having opposed, substantially planar top and bottom surfaces 532 and 534, an integrated circuit die 550 having opposed, substantially planar top and bottom surfaces 552 and 554, and a plurality of conductive wires 560 for electrically connecting the integrated circuit die 550 to the first and second leads 520 and 530.

Encapsulant 570 is also provided for encapsulating the first and second leads 520 and 530, the integrated circuit die 550, and the conductive wires 560. In addition, bottom surfaces 524 and 534 of the first and second leads 520 and 530 are exposed in an exterior surface of the encapsulant 570 (i.e., the bottom surface thereof).

The first leads 520 are arranged in a spaced, generally parallel pair of rows which are separated from each other at a predetermined distance. The first leads 520 of each row are aligned with and extend in opposed relation to a respective one of the first leads 520 of the remaining row. The bottom surfaces 524 of first leads 520 are partially etched to form partially etched surfaces 527 having a predetermined depth. In addition, the top surfaces 522 of first leads 520 are partially etched to form partially etched surfaces 526 having a predetermined depth.

The second leads 530 are also segregated into a spaced, generally parallel pair of rows which extend to respective ones of an opposed pair of peripheral sides of the encapsulant 570. The second leads 530 of each row are separated from a respective row of the first leads 520 by a predetermined distance. Additionally, the second leads 530 of each row are aligned with respective ones of the first leads 520 of the row disposed closest thereto. Thus, the first and second leads 520 and 530 are provided in equal numbers. The bottom surfaces 534 of second leads 530 are partially etched to include partially etched surfaces 336 having predetermined depths.

The bottom surface 554 of die 550 is placed upon and bonded to inner portions of the top surfaces 522 of the first leads 520 through the use of an adhesive 540. A plurality of bond pads 556 formed at the top surface 552 of die 550 are connected to top surfaces 522 and 532 of first and second leads 520 and 530 by conductive wires 560.

Figure 7A:
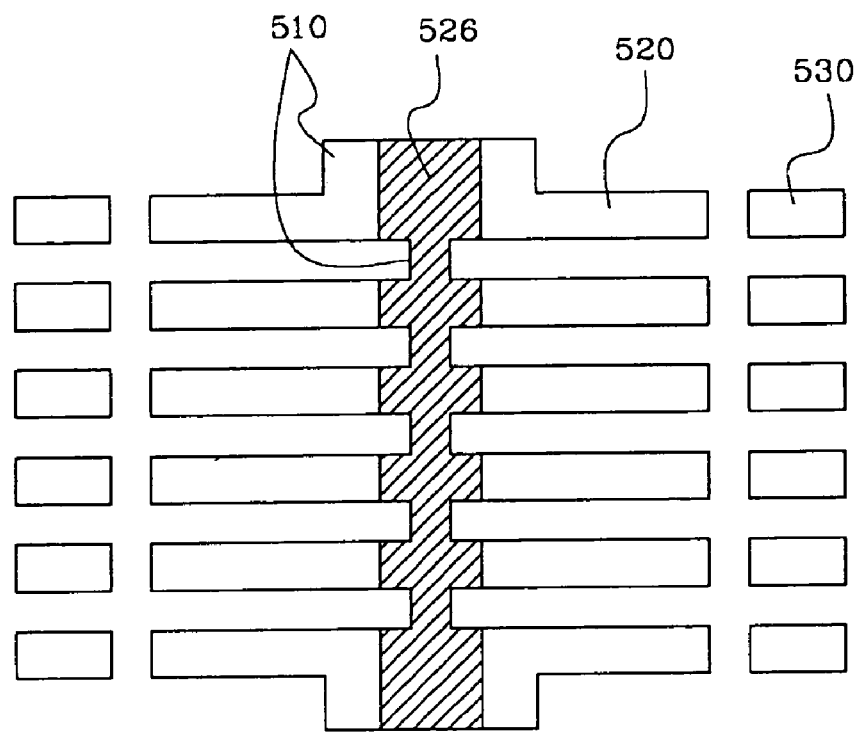
FIGS. 7A–F are views illustrating steps in a method for manufacturing the semiconductor package of FIG. 6A.

As illustrated in FIGS. 6B and 7A, a die paddle 510 having a predetermined area interconnects the first leads 520, and accommodates the integrated circuit die 550 so that it can be bonded in a stable manner to the first leads 520. In one embodiment, die paddle 510 has the same thickness as the first leads 520 and is flush with the first leads 520. As shown in FIG. 7A, the die paddle 510 includes a partially etched surface 526 which extends into portions of each of the first leads 520.

A single channel 580 having a predetermined depth is formed between those portions of the partially etched surface 526 extending into each of first leads 520. Channel 580 serves to electrically insulate and physically/symmetrically separate the first leads 520 from each other. In one embodiment, the depth of channel 580 is selected to pass through a portion of the partially etched surface 526 without damaging integrated circuit die 550. As a result of the formation of the channel 580, a portion of the partially etched surface 526 remains in the inner end of each of the first leads 520, thus resulting in each of the first leads 520 defining a partially etched surface 526 as indicated above. After channel 580 is formed, side surfaces 528 adjacent to the partially etched surfaces 526 of the first leads 520 are exposed in the encapsulant 570 within the channel 580.

Figure 7B:
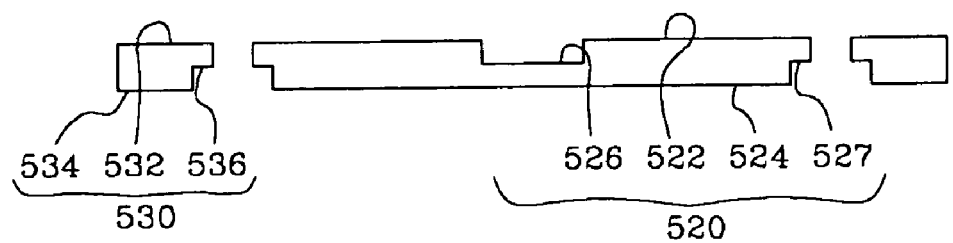

FIGS. 7A–F are views illustrating steps in a method for manufacturing semiconductor package 500 of FIG. 6A. FIGS. 7A and 7B illustrate plan and sectional views of a lead frame providing step used in the manufacture of semiconductor package 500 of FIG. 6A. Die paddle 510 is provided having a partially etched surface 526 at its upper center portion, with first leads 520 extending from each of the opposed sides of the die paddle 510. A predetermined part of the partially etched surface 526 is removed during a subsequent channel formation step (illustrated in FIG. 7F). As illustrated in FIG. 7B, partially etched surface 526 is of a prescribed depth relative to the top surfaces 522 of first leads 520.

Figure 7C:
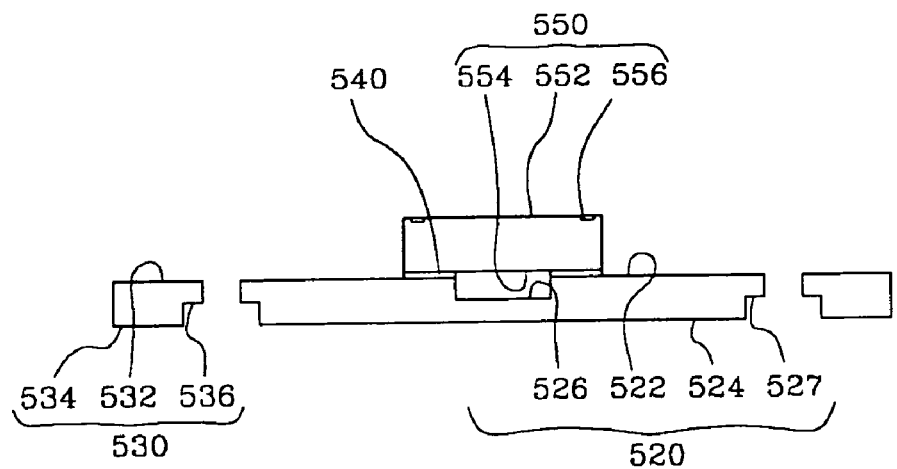

FIG. 7C illustrates a die attaching step used in the manufacture of semiconductor package 500 of FIG. 6A. The bottom surface 554 of the integrated circuit die 550 is placed upon and bonded to the opposed end portions of the die paddle 510 and the top surfaces 522 of the first leads 520 through the use of an adhesive 540.

Figure 7D:
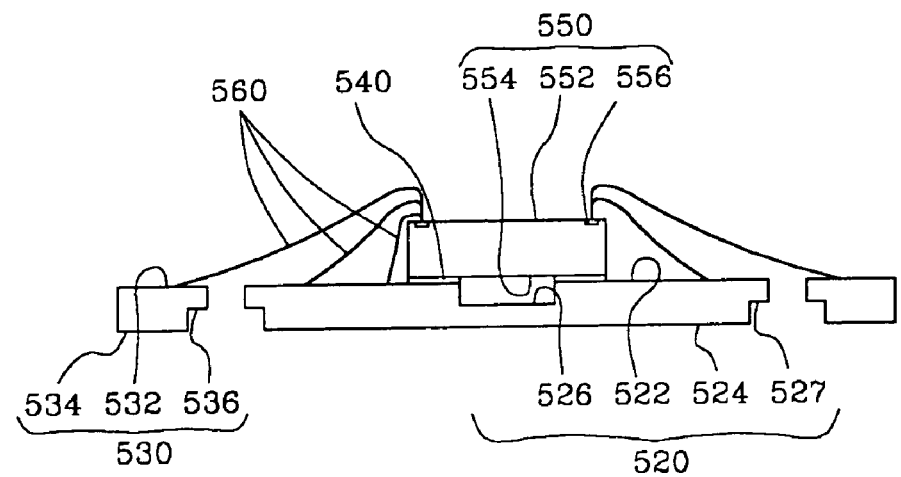

FIG. 7D illustrates a wire bonding step used in the manufacture of semiconductor package 500 of FIG. 6A. The bond pads 556 of the integrated circuit die 550 are electrically connected to the top surfaces 522 and 532 of the first and second leads 520 and 530 through the use of conductive wires 560.

Figure 7E:
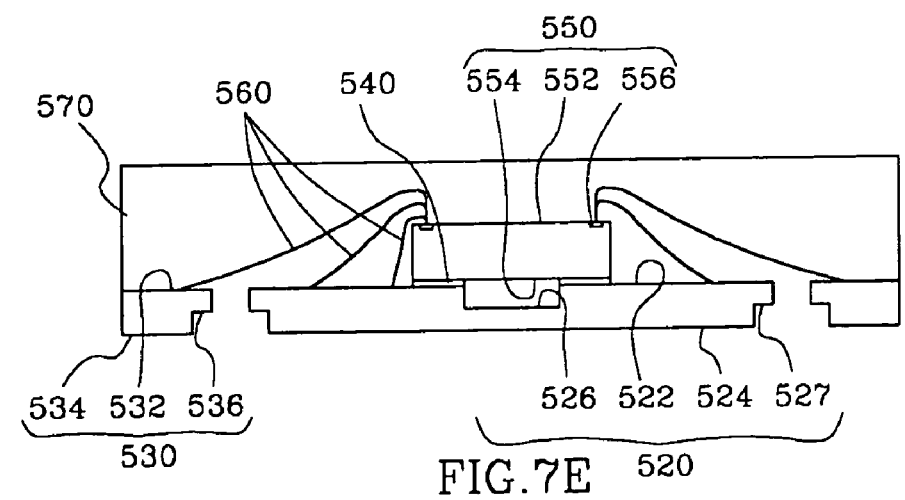

FIG. 7E illustrates an encapsulating step used in the manufacture of semiconductor package 500 of FIG. 6A. First and second leads 520 and 530, integrated circuit die 550, and conductive wires 560 are encapsulated by the encapsulant 570. The encapsulant 570 protects these components from the external environment and allows semiconductor package 500 to be mounted on external devices in a fixed shape. After the encapsulating step, bottom surfaces 524 and 534 of the first and second leads 520 and 530 are exposed in the bottom surface of the encapsulant 570.

Figure 7F:
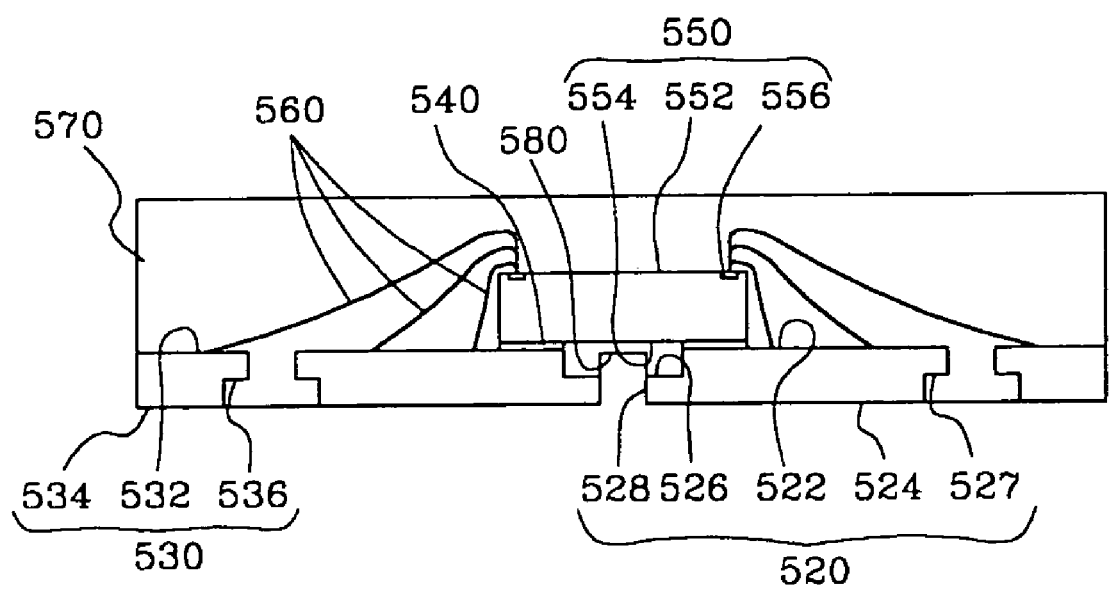

FIG. 7F illustrates a channel forming step used in the manufacture of semiconductor package 500 of FIG. 6A. A single channel 580 having a predetermined depth is formed between the first leads 520, and passes through a portion of the partially etched surface 526. As a result, facing first leads 520 are physically separated and electrically insulated from each other. In one embodiment, a substantial portion of die paddle 510 is removed as a result of the cutting of channel 580. The width of channel 580 can be made smaller than that of partially etched surface 526 such that a predetermined region of the partially etched surface 526 is located on the inside of encapsulant 570. As previously explained, the cutting operation is completed such that a portion of the partially etched surface 526 remains on the inner end of each of the first leads 520 as is seen in FIG. 7F. The depth of channel 580 is preferably less than the thickness of the first leads 520 in order to prevent damage to integrated circuit die 510.

As a result of these manufacturing steps, the first and second leads 520 and 530 can be arrayed on package 500 as illustrated in FIG. 6B, thereby maximizing the number of input and output pads in the semiconductor package 500.

Figure 8A:
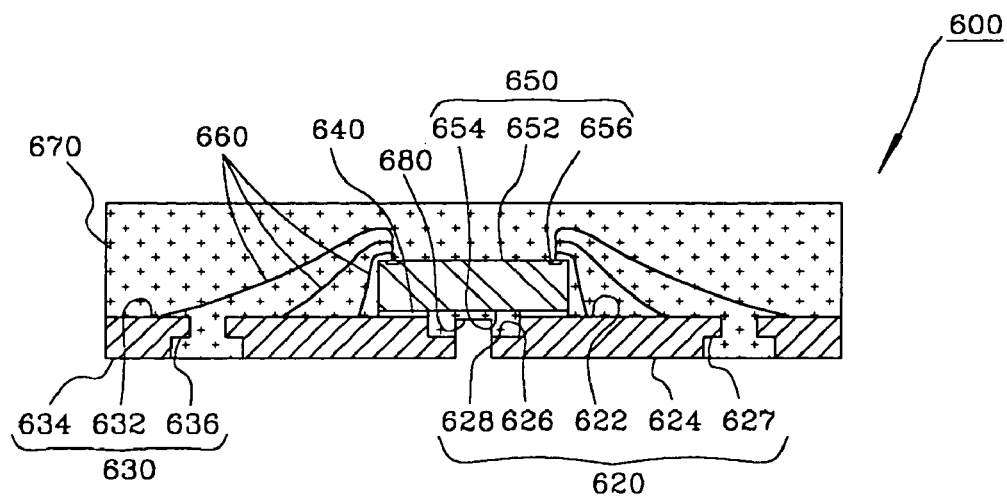
FIG. 8A is a sectional view of a semiconductor package having leads separated by a single channel.
Figure 8B:
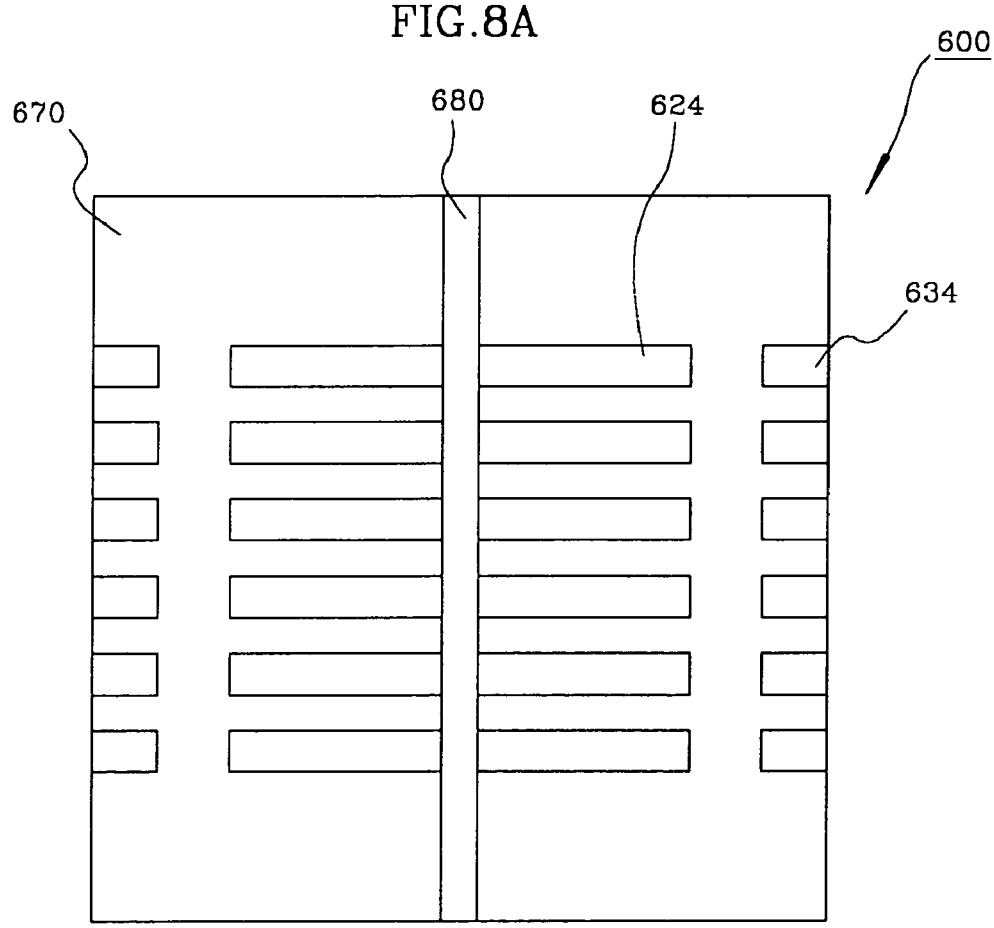
FIG. 8B is a bottom plan view of the semiconductor package of FIG. 8A.

FIG. 8A is a sectional view of a semiconductor package 600 having leads separated by a single channel. FIG. 8B is a bottom view of the semiconductor package 600 of FIG. 8A. It will be appreciated that the structure of package 600 is similar to the structure of package 500 described above. However, the die paddle 510 included in the semiconductor package 500 is not included in the semiconductor package 600. Instead, in the semiconductor package 600, integrated circuit die 650 is placed upon and bonded to top surfaces 622 of first leads 620 without the inclusion of a die paddle interconnecting the first leads 620. Thus, in contrast to package 500, first leads 620 of package 600 are not connected to a die paddle.

Figure 9A:
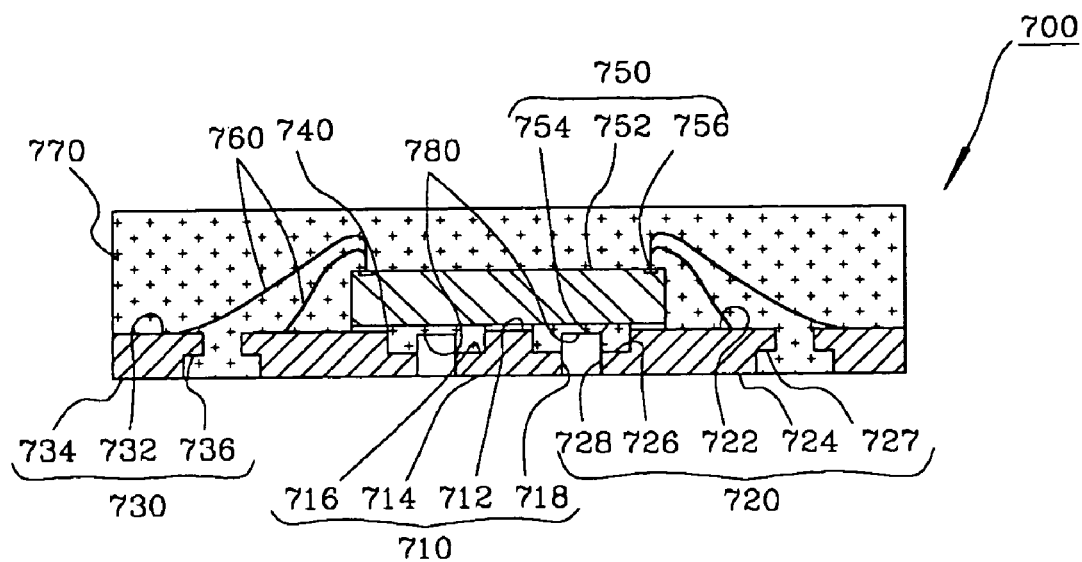
FIG. 9A is a sectional view of a semiconductor package having a die pad and leads separated by two channels.
Figure 9B:
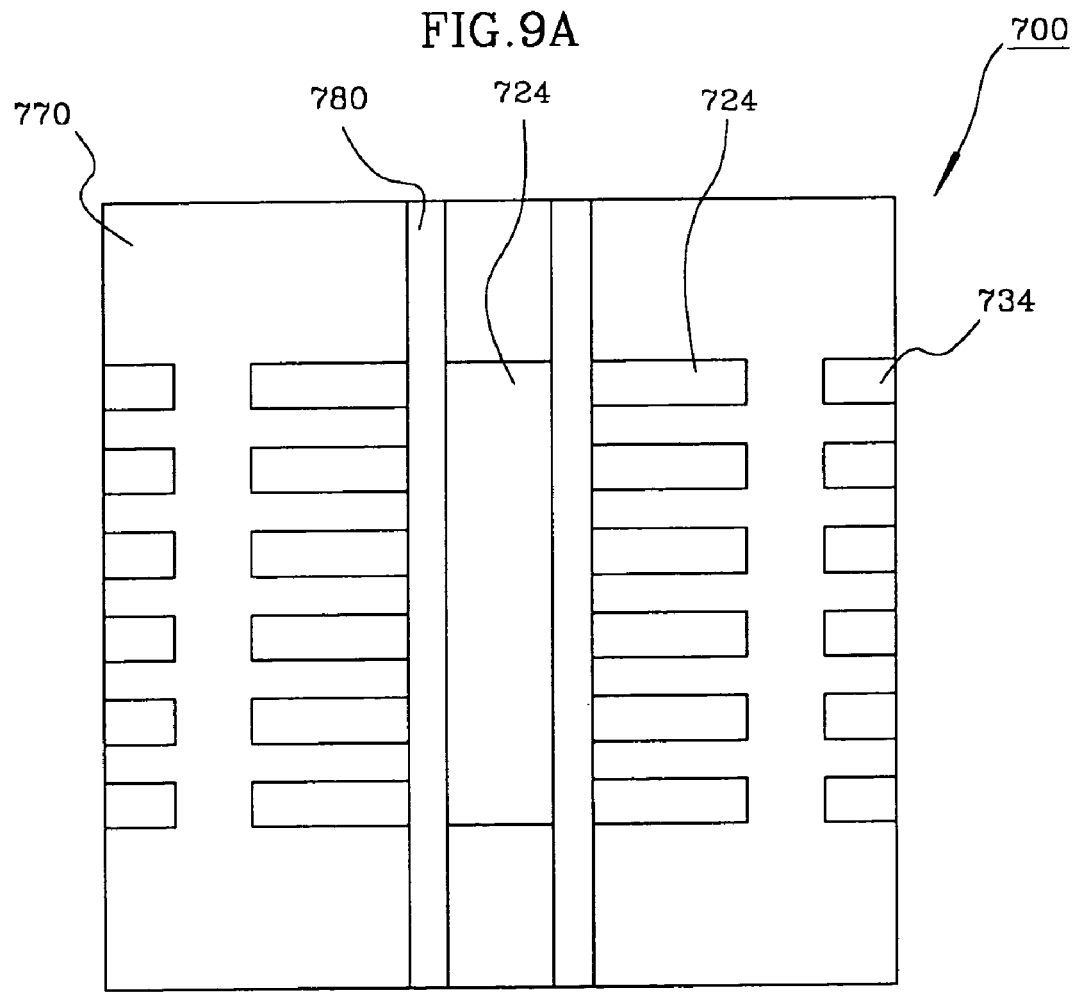
FIG. 9B is a bottom plan view of the semiconductor package of FIG. 9A.

FIG. 9A is a sectional view of a semiconductor package 700 having a die pad and leads separated by two channels. FIG. 9B is a bottom view of the semiconductor package 700 of FIG. 9A. As shown, semiconductor package 700 includes a plurality of first leads 720 having opposed, substantially planar top and bottom surfaces 722 and 724, a plurality of second leads 730 having opposed, substantially planar top and bottom surfaces 732 and 734, a die pad 710 having opposed, substantially planar top and bottom surfaces 712 and 714, an integrated circuit die 750 having opposed, substantially planar top and bottom surfaces 752 and 754, and a plurality of conductive wires 760 for electrically connecting the integrated circuit die 750 to the first and second leads 720 and 730.

Encapsulant 770 is also provided for encapsulating the first and second leads 720 and 730, the die pad 710, the integrated circuit die 750, and the conductive wires 760. In addition, bottom surfaces 714, 724, and 734 of the leads 720 and 730 and die pad 710 are exposed in an exterior surface of the encapsulant 770 (i.e., the bottom surface thereof).

The first leads 720 are arranged in a spaced, generally parallel pair of rows which are separated from each other at a prescribed distance. The bottom surfaces 724 of first leads 720 are partially etched to form partially etched surfaces 727 having a predetermined depth. In addition, the top surfaces 722 of first leads 520 are partially etched to form partially etched surfaces 726 having a predetermined depth.

The second leads 730 are also segregated into a spaced, generally parallel pair of rows which are outboard of the first leads 720 and separated from a respective row of the first leads 720 by a predetermined distance, the second leads 730 extending to respective ones of an opposed pair of sides of the encapsulant 770. The second leads 730 of each row are aligned with respective ones of the first leads 720 of the row disposed closest thereto. Thus, the first and second leads 720, 730 are provided in equal numbers. The bottom surfaces 734 of second leads 730 are partially etched to form partially etched surfaces 736 having a predetermined depth.

The top surface 712 of die pad 710 is also partially etched to form partially etched surfaces 716 having a predetermined depth.

The bottom surface 754 of die 750 is placed upon and bonded to the top surfaces 712 and 722 of the die pad 710 and first leads 720 through the use of an adhesive 740. A plurality of bond pads 756 formed at the top surface 752 of die 750 are connected to top surfaces 722 and 732 of first and second leads 720 and 730 by conductive wires 760.

Two channels 780 having predetermined depths are formed between the first leads 720 and the die paddle 710, thus separating the first leads 720 from the die paddle 710. In one embodiment, the channel depth is selected so as to sever portions of die paddle 710 and first leads 720 without damaging die 750. As a result of forming channels 780, side surfaces 718 and 728 adjacent to partially etched surfaces 716 and 726 of the die paddle 710 and the first leads 720 are exposed in the encapsulant 770 within the channels 780.

Figure 10:
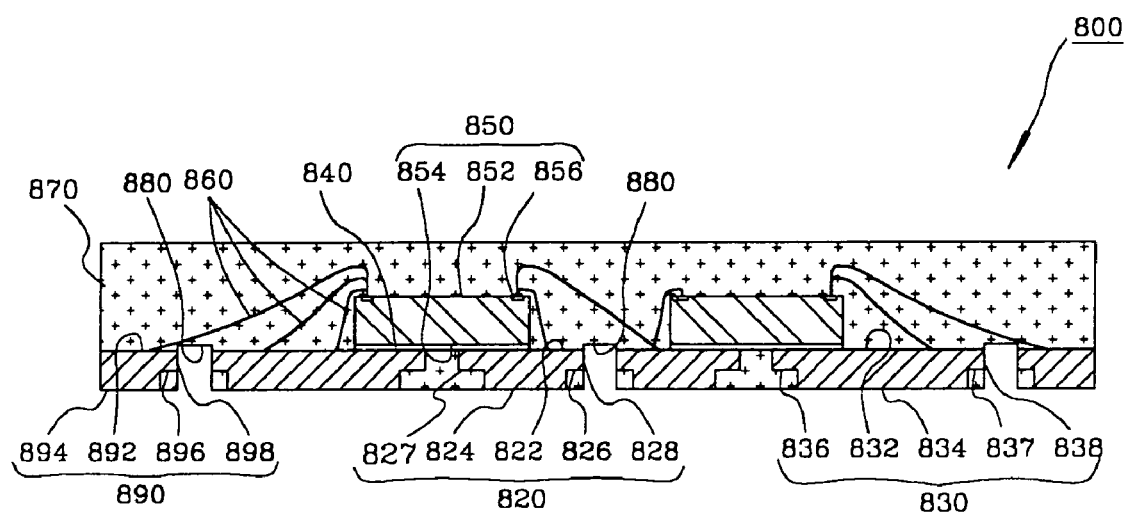
FIG. 10 is a sectional view of a semiconductor package having multiple dies attached to first and second leads.

FIG. 10 is a sectional view of a semiconductor package 800 having multiple dies attached to first and second leads. Semiconductor package 800 includes a plurality of first leads 820 having opposed, substantially planar top and bottom surfaces 822 and 824, a plurality of second leads 830 having opposed, substantially planar top and bottom surfaces 832 and 834, a plurality of third leads 890 having opposed, substantially planar top and bottom surfaces 892 and 894, two integrated circuit dies 850 having substantially planar top and bottom surfaces 852 and 854, and a plurality of conductive wires 860 for electrically connecting the integrated circuit dies 850 to the first, second, and third leads 820, 830, and 890. Encapsulant 870 is also provided for encapsulating the first, second, and third leads 820, 830, and 890, integrated circuit die 850, and conductive wires 860. In addition, portions of the first, second, and third leads 820, 830, and 890 are exposed in an exterior surface of the encapsulant 870 (i.e., the bottom surface thereof).

The bottom surfaces 824 of first leads 820 are partially etched to form partially etched surfaces 826 and 827 having a predetermined depth. The bottom surfaces 834 of second leads 830 are also partially etched to form partially etched surfaces 836 having a predetermined depth. In addition, the bottom surfaces 894 of third leads 890 are partially etched to form partially etched surfaces 896 having a predetermined depth.

First leads 820 are arranged in a spaced, generally parallel pair of rows which are separated from each other at a predetermined distance, with each of the first leads 820 of one row being aligned with a respective one of the first leads 820 of the remaining row. The second leads are also segregated into a spaced, generally parallel pair of rows which are outboard of the rows of first leads 820. In this regard, the rows of second leads 830 are separated from a respective row of the first leads 820 by a predetermined distance, with the second leads 830 of each row being aligned with respective ones of the first leads 820 of the row disposed closest thereto. In a similar fashion, the third leads 890 are also segregated into two generally parallel rows which are outboard of the rows of second leads 830 and separated from a respective row of the second leads 830 by a predetermined distance. The third leads 890 of each row are preferably aligned with respective ones of the second leads 830 of the row disposed closest thereto. Thus, the first, second and third leads 820, 830 and 890 are preferably provided in equal numbers.

The bottom surfaces 854 of dies 850 are placed upon and bonded to the top surfaces 822 and 832 of the first and second leads 820 and 830 through the use of an adhesive 840. A plurality of bond pads 856 formed at the top surfaces 852 of dies 850 are connected to certain ones of the first, second and third leads 820, 820 and 890 by conductive wires 860.

As illustrated in FIG. 10, three channels 880 having predetermined depths are formed in the bottom surface of the encapsulant 870. Two of the channels 880 are formed between partially etched surfaces 837 of the second leads 830 and the partially etched surfaces 896 of the third leads 890, thus physically separating and electrically insulating the second and third leads 830 and 890 from each other. A third channel 880 is formed between partially etched surfaces 826 of first leads 820, thus physically separating and electrically insulating the first leads 820 from each other. In one embodiment, the channel depth is selected to be slightly larger than the thickness of the first, second or third leads 820, 830 or 890.

As a result of forming channels 880, side surfaces 828 of the first leads 820 as well as side surfaces 838 and 898 of second and third leads 830 and 890 are exposed in the encapsulant 870 within respective ones of the channels 880.

Figure 11:
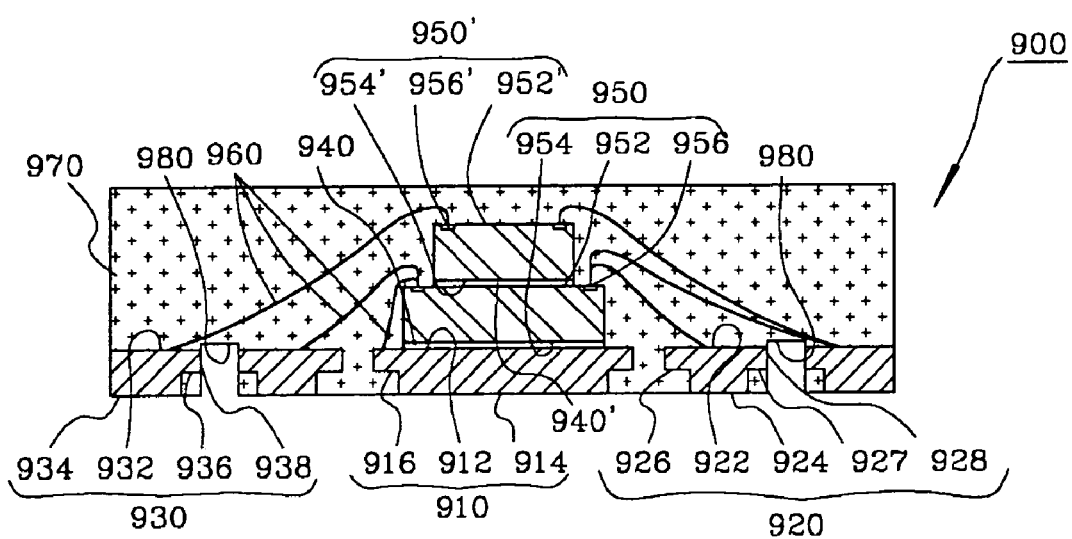
FIG. 11 is a sectional view of a semiconductor package having multiple stacked dies.

FIG. 11 is a sectional view of a semiconductor package 900 having multiple stacked dies. It will be appreciated that the structure of package 900 is similar to the structure of package 100 described above. However, package 900 further includes an additional integrated circuit die.

As shown in FIG. 11, package 900 includes a first integrated circuit die 950 bonded to a top surface 912 of a die paddle 910 by an adhesive 940. A second integrated circuit die 950' is bonded to a top surface 952 of the first integrated circuit die 950 through the use of an adhesive 940'. The second integrated circuit die 950' includes opposed, substantially planar top and bottom surfaces 952' and 954', and bond pads 956' formed on the top surface 952'. Bond pads 956' of the second integrated circuit die 950' are electrically connected to the first and second leads 920 and 930 through the use of conductive wires 960.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   a semiconductor die;
   a plurality of first leads defining an inner set which extends at least partially about the semiconductor die in spaced relation thereto, each of the first leads defining opposed, generally planar top and bottom surfaces and a partially etched surface which is recessed relative to the bottom surface;
   a plurality of second leads defining an outer set which extends at least partially about the inner set in spaced relation thereto, each of the second leads defining opposed, generally planar top and bottom surfaces and a partially etched surface which is recessed relative to the bottom surface, the semiconductor die being electrically connected to at least one of each of the first and second leads;
   an encapsulant for encapsulating the semiconductor die and the first and second leads such that the bottom surfaces of the first and second leads are at least partially exposed in the encapsulant; and
   a channel disposed in the encapsulant and separating the inner and outer sets from each other, the partially etched surfaces of the first and second leads extending to the channel.

2. The semiconductor package of claim 1 further comprising:
   a die paddle defining opposed, generally planar top and bottom surfaces;
   the semiconductor die being attached to the top surface of the die paddle, with the first leads of the inner set extending at least partially about the die paddle in spaced relation thereto.

3. The semiconductor package of claim 2 wherein:
   the semiconductor die includes a plurality of bond pads;
   a plurality of conductive wires are used to electrically connect the bond pads to the top surfaces of respective ones of the first and second leads; and
   the conductive wires are encapsulated by the encapsulant.

4. The semiconductor package of claim 1 wherein:
   the inner and outer sets are each arranged in a generally quadrangular array; and
   the channel defines four segments which intersect each other at substantially right angles.

5. The semiconductor package of claim 4 wherein each of the first leads of the inner set is aligned with a respective one of the second leads of the outer set.

6. The semiconductor package of claim 4 wherein the first leads and the second leads extending along each of the segments of the channel are arranged in staggered relation to each other.

7. The semiconductor package of claim 1 wherein portions of each of the first and second leads are exposed in the encapsulant within the channel.

8. The semiconductor package of claim 2 further comprising a second semiconductor die attached to the semiconductor die and electrically connected to at least one of the first and second leads.

9. The semiconductor package of claim 2 wherein the partially etched surfaces are covered by the encapsulant.

10. A semiconductor package comprising:
    a semiconductor die defining multiple sides;
    at least two rows of first leads defining an inner set which is arranged to extend along respective sides of the semiconductor die, each of the first leads defining opposed, generally planar top and bottom surfaces and a partially etched surface which is recessed relative to the bottom surface;
    at least two rows of second leads defining an outer set which is arranged to extend along respective ones of the rows of the first leads inner set in spaced relation thereto, the rows of the outer set being disposed further from the semiconductor die than the rows of the inner set, with each of the second leads defining opposed, generally planar top and bottom surfaces and a partially etched surface which is recessed relative to the bottom surface, the semiconductor die being electrically connected to at least one of each of the first and second leads;
    an encapsulant for encapsulating the first and second leads and the semiconductor die such that the bottom surfaces of the first and second leads are at least partially exposed in the encapsulant; and
    a channel disposed in the encapsulant and separating the inner and outer sets from each other, the partially etched surfaces of the first and second leads extending to the channel.

11. The semiconductor package of claim 10 wherein:
    the semiconductor die includes a plurality of bond pads disposed thereon;
    a plurality of conductive wires are used to electrically connect the bond pads to the top surfaces of respective ones of the first and second leads; and
    the conductive wires are encapsulated by the encapsulant.

12. The semiconductor package of claim 10 wherein portions of each of the first and second leads are exposed in the encapsulant within respective ones of the channels.

13. The semiconductor package of claim 10 wherein the partially etched surfaces are covered by the encapsulant.

14. The semiconductor package of claim 10 wherein each of the first leads of the inner set is aligned with a respective one of the second leads of the outer set.

15. The semiconductor package of claim 10 further comprising:
a die pad defining opposed, generally planar top and bottom surfaces and multiple sides;
the semiconductor die being attached to the top surface of the die pad, with the first leads of the inner set extending along respective sides of the die pad in spaced relation thereto.

16. The semiconductor package of claim 15 wherein the die pad includes at least one partially etched surface covered by the encapsulant.

17. A semiconductor package comprising:
a semiconductor die defining multiple sides;
a plurality of first leads defining an inner set which is segregated into multiple rows extending along respective sides of the semiconductor die in spaced relation thereto, each of the first leads defining opposed, generally planar top and bottom surfaces and a partially etched surface which is recessed relative to the bottom surface;
a plurality of second leads defining an outer set which is segregated into multiple rows extending along respective rows of the inner set in spaced relation thereto such that the rows of the inner set extend between the semiconductor die and the rows of the outer set, each of the second leads defining opposed, generally planar top and bottom surfaces and a partially etched surface which is recessed relative to the bottom surface, the semiconductor die being electrically connected to at least one of each of the first and second leads;
an encapsulant for encapsulating the semiconductor die and the first and second leads such that the bottom surfaces of the first and second leads are at least partially exposed in the encapsulant; and
a channel disposed in the encapsulant and separating the inner and outer sets from each other, the partially etched surfaces of the first and second leads extending to the channel.

18. The semiconductor package of claim 17 further comprising:
a die paddle defining opposed, generally planar top and bottom surfaces and multiple sides;
the semiconductor die being attached to the top surface of the die paddle, with the rows of the first leads of the inner set extending along respective sides of the die paddle in spaced relation thereto.

19. The semiconductor package of claim 17 wherein:
the semiconductor die includes a plurality of bond pads;
a plurality of conductive wires are used to electrically connect the bond pads to the top surfaces of respective ones of the first and second leads; and
the conductive wires are encapsulated by the encapsulant.

20. The semiconductor package of claim 17 wherein:
the inner and outer sets are each arranged in a generally quadrangular array; and
the channel defines four segments which intersect each other at substantially right angles.

21. The semiconductor package of claim 20 wherein each of the first leads of the inner set is aligned with a respective one of the second leads of the outer set.

22. The semiconductor package of claim 17 wherein portions of each of the first and second leads are exposed in the encapsulant within the channel.

23. The semiconductor package of claim 18 wherein the die paddle includes at least one partially etched surface covered by the encapsulant.

24. The semiconductor package of claim 17 wherein the partially etched surfaces are covered by the encapsulant.

* * * * *

UNITED STATES PATENT AND TRADEMARK OFFICE
CERTIFICATE OF CORRECTION

PATENT NO.    : 6,927,483 B1
DATED         : August 9, 2005
INVENTOR(S)   : Sun Goo Lee, Choon Heung Lee and Sang Ho Lee It is certified that error appears in the above-identified patent and that said Letters Patent is hereby corrected as shown below:

Column 14,
Line 39, should be corrected to read as follows: -- the rows of the inner set in spaced relation --.

Signed and Sealed this

Fourth Day of October, 2005

JON W. DUDAS
*Director of the United States Patent and Trademark Office*